United States Patent
Usami et al.

(10) Patent No.: US 11,302,596 B2
(45) Date of Patent: Apr. 12, 2022

(54) SEMICONDUCTOR DEVICE

(71) Applicant: RENESAS ELECTRONICS CORPORATION, Tokyo (JP)

(72) Inventors: Tatsuya Usami, Tokyo (JP); Hironobu Miyamoto, Tokyo (JP); Masami Sawada, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 153 days.

(21) Appl. No.: 15/931,230

(22) Filed: May 13, 2020

(65) Prior Publication Data

US 2021/0028082 A1 Jan. 28, 2021

(30) Foreign Application Priority Data

Jul. 22, 2019 (JP) .............................. JP2019-134668

(51) Int. Cl.
| | |
|---|---|
| *H01L 23/367* | (2006.01) |
| *H01L 23/373* | (2006.01) |
| *H01L 29/16* | (2006.01) |
| *H01L 29/20* | (2006.01) |
| *H01L 29/24* | (2006.01) |

(52) U.S. Cl.
CPC ........ *H01L 23/367* (2013.01); *H01L 23/3736* (2013.01); *H01L 29/16* (2013.01); *H01L 29/1608* (2013.01); *H01L 29/2003* (2013.01); *H01L 29/24* (2013.01)

(58) Field of Classification Search
None
See application file for complete search history.

(56) References Cited

U.S. PATENT DOCUMENTS

| | | |
|---|---|---|
| 2007/0007595 A1 | 1/2007 | Hirano et al. |
| 2016/0315075 A1 | 10/2016 | Toyoda et al. |
| 2018/0308968 A1 | 10/2018 | Miura et al. |
| 2020/0058804 A1 | 2/2020 | Hirabayashi et al. |
| 2021/0028082 A1* | 1/2021 | Usami ................ H01L 29/0692 |

FOREIGN PATENT DOCUMENTS

| | | |
|---|---|---|
| JP | 2004-349537 A | 12/2004 |
| JP | 2016-207827 A | 12/2016 |
| JP | 2018-078177 A | 5/2018 |
| JP | 2018-182247 A | 11/2018 |

* cited by examiner

*Primary Examiner* — Jack S Chen
(74) *Attorney, Agent, or Firm* — McDermott Will & Emery LLP

(57) ABSTRACT

A Semiconductor device includes a substrate and a thermal conductive film. The substrate has a top surface and a back surface which oppose with each other. A first opening is formed on the back surface of substrate. The thermal conductive film includes a first thermal conductive portion formed in the first opening. The first thermal conductive portion is embedded in the first opening such that a void is formed in the first opening.

18 Claims, 43 Drawing Sheets

SEMICONDUCTOR DEVICE

CROSS-REFERENCE TO RELATED APPLICATIONS

The disclosure of Japanese Patent Application No. 2019-134668 filed on Jul. 22, 2019 including the specification, drawings and abstract is incorporated herein by reference in its entirety.

BACKGROUND

Present embodiments relate to a semiconductor device, for example, to a semiconductor device including a heat dissipation structure.

There are disclosed techniques listed below.

[Patent Document 1] Japanese Unexamined Patent Application Publication No. 2004-349537

[Patent Document 2] Japanese Unexamined Patent Application Publication No. 2018-078177

From the viewpoint of increasing heat dissipation, it is known a semiconductor device including a semiconductor substrate in which a heat conductive film for heat dissipation is formed therein (for example, see Patent Document 1 and Patent Document 2). In the semiconductor devices described in Patent Documents 1 and 2, a thermal conductive film is embedded in an opening formed in the semiconductor substrate. A thermal conductivity of a material of the thermal conductive film is greater than a thermal conductivity of a material of the semiconductor substrate. This allows the heat generated by the semiconductor element in the semiconductor device to be efficiently dissipated to the outside through the thermal conductive film.

However, a thermal expansion coefficient of the material of the thermal conductive film, and a thermal expansion coefficient of the material of the semiconductor substrate, different from each other. Due to the difference in the thermal expansion coefficients, the semiconductor substrate may warp or crack during manufacturing the semiconductor device. As a result, crystalline defects may occur in the semiconductor substrate, increasing the leakage current. Thus, in the conventional semiconductor device, there is room for improvements from the viewpoint of enhancing the characteristics of semiconductor device.

A problem of the present embodiments is improving of the characteristics of the semiconductor device. Other problems and novel features will become apparent from the description of the specification and drawings.

SUMMARY

A semiconductor device according to embodiments includes a substrate and a thermal conductive film. A first opening is formed on a back surface of the substrate. The thermal conductive film includes a first thermal conductive portion formed in the first opening. The first thermal conductive portion is embedded in the first opening such that a void is formed in the first opening.

According to embodiments, the characteristics of the semiconductor device can be improved.

Figure 1:
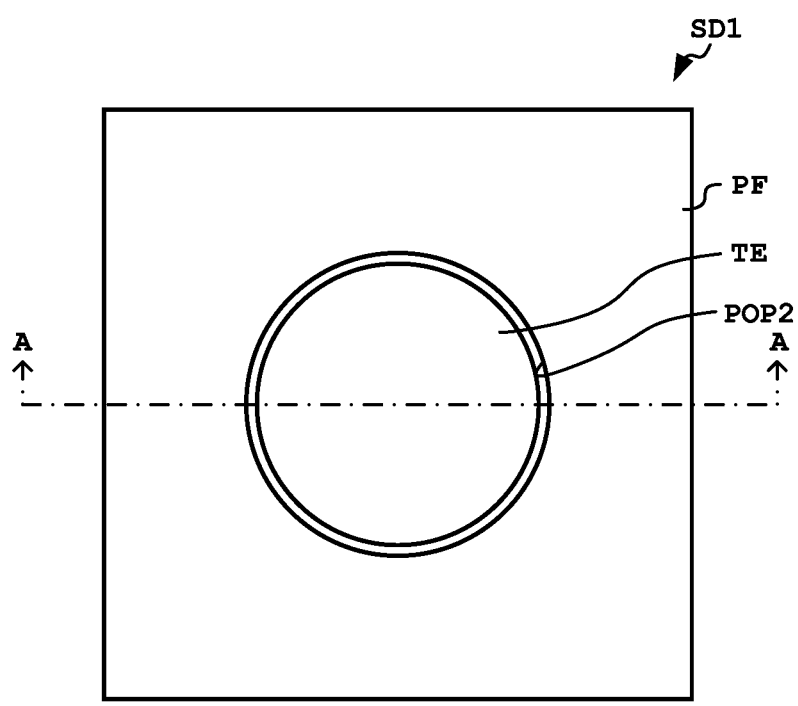
FIG. 1 is a plan view showing an exemplary configuration of a semiconductor device according to a first embodiment.

Hereinafter, a semiconductor device according to embodiments will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. At least a part of each embodiment and each modification may be arbitrarily combined with each other. In addition, a cross-sectional view may also be shown as an end view.

FIRST EMBODIMENT

A semiconductor device SD1 according to a first embodiment includes a semiconductor substrate SSB1 in which a first opening OP1 is formed. As a void VD (cavity) is formed inside the first opening OP1, a thermal conductive film TCF for heat dissipation is formed.

(Configuration of Semiconductor Device)

Figure 2:
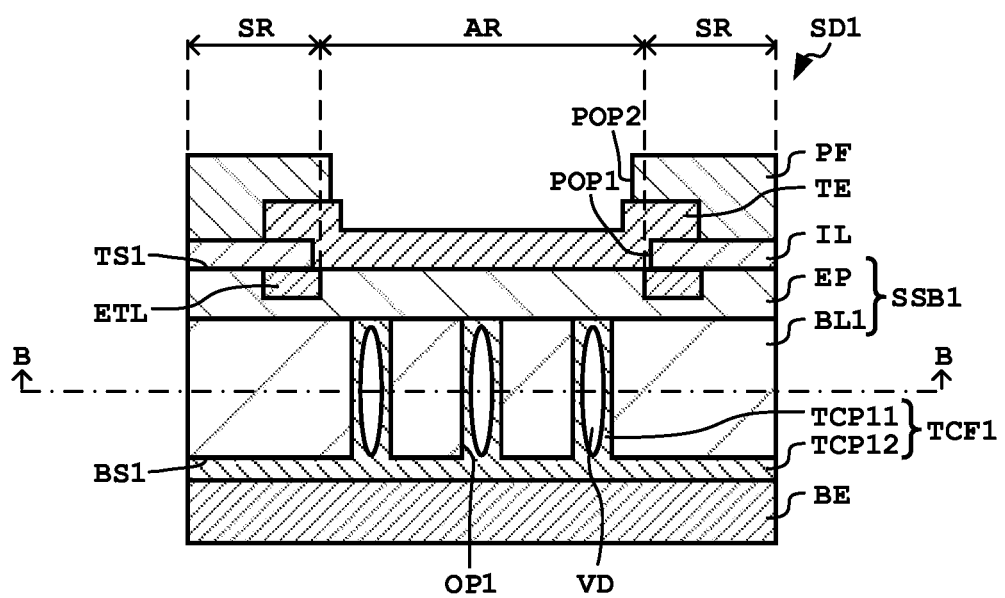
FIG. 2 is cross-sectional view showing the semiconductor device taken along line A-A of FIG. 1.
Figure 3:
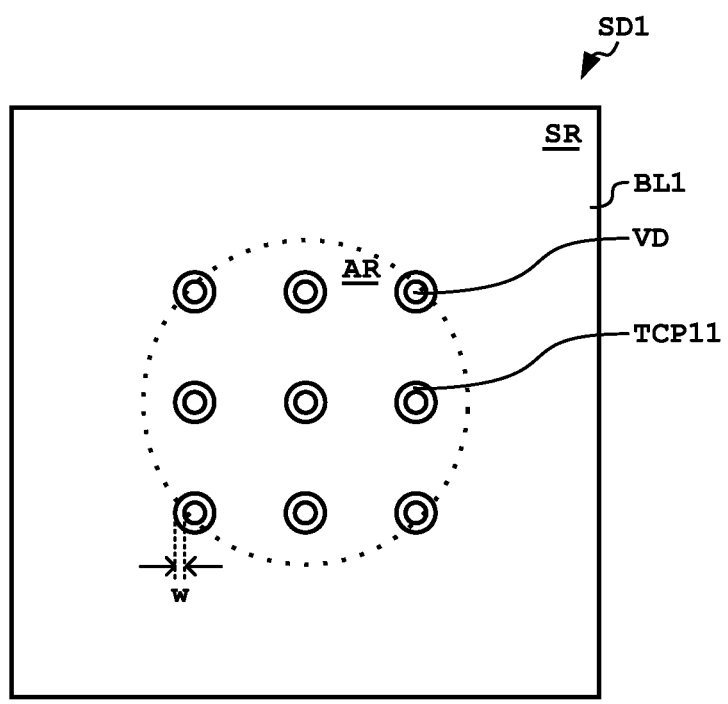
FIG. 3 is cross-sectional view of semiconductor device in line B-B of FIG. 2.

FIG. 1 is a plan view showing an exemplary configuration of the semiconductor device SD1 according to the first embodiment. FIG. 2 is a cross-sectional view showing the semiconductor device SD1 taken along line A-A of FIG. 1. FIG. 3 is a cross-sectional view showing the semiconductor device SD1 taken along line B-B of FIG. 2.

As shown in FIGS. 2 and 3, the semiconductor device SD1 includes an active region AR in which a main current flow in of the semiconductor substrate SSB1, and a peripheral region SR surrounding the active region AR in plan view. In the semiconductor device SD1 according to the first embodiment, as a semiconductor element, a Schottky barrier diode is formed in the active region AR. "Main current" is, for example, a current flowing between an anode electrode (top electrode TE) and a cathode electrode (back electrode BE). A broken line in FIG. 3 indicates a boundary line between the active region AR and the peripheral region SR.

The semiconductor device SD1 includes a semiconductor substrate SSB1, an insulating layer IL, a top electrode TE, a thermal conductive film TCF1, a back electrode BE, and a protective film PF.

The semiconductor device SD1 includes a top surface (upper surface) TS1 and a back surface (lower surface) BS1 located opposite to each other. The semiconductor substrate SSB1 includes a base layer BL1, and an epitaxial layer EP formed on the base layer BL1. The base layer BL1 is located on the back surface BS1 side in the semiconductor substrate SSB1, and the epitaxial layer EP is located on the top surface TS1 side in the semiconductor substrate SSB1.

A first opening OP1 is formed on the back surface BS1 of semiconductor substrate SSB1. A bottom portion of the first opening OP1 may be located in the base layer BL1 or in the epitaxial layer EP. If a bottom surface of the first opening OP1 is located inside the epitaxial layer EP, from the viewpoint of ensuring a sufficient pressure resistance, and increasing the heat dissipation, in a thickness direction of semiconductor substrate SSB1, a distance between the top surface TS1 of the semiconductor substrate SSB1 (a surface of the epitaxial layer EP) and the bottom surface and of the first opening OP1 is preferable 3 μm or more and 10 μm or less. In the first embodiment, the bottom surface of the first opening OP1 is located in the base layer BL1. More specifically, the bottom surface of the first opening OP1 is located on the interface between the base layer BL1 and the epitaxial layer EP. In the bottom portion of the first opening OP1, the epitaxial layer EP is exposed.

As will be described later in detail, a portion of the thermal conductive film TCF1 (first thermal conductive portion TCP11) is embedded in the first opening OP1 so that the void VD is formed. The first opening OP1 defines a size, a configuration, a position, and a number of the first thermal conductive portion TCP11. The size, shape, position and number of the first opening OP1 can be appropriately adjusted in accordance with the desired heat dissipation obtained by the thermal conductive film TCF1.

An aspect ratio of the first opening OP1 is preferably 2 or more and 20 or less, and more preferably 5 or more and 10 or less from the viewpoint of appropriately forming the void VD in the first opening OP1.

Examples of material of the semiconductor substrate SSB1 (the base layer BL1) include gallium oxide ($Ga_2O$), gallium nitride (GaN), silicon (Si) and silicon carbide (SiC). Examples of a crystal structure of gallium oxide include α-type, β-type, γ-type, δ-type and ε-type. A thermal expansion coefficient and a thermal conductivity of the above examples of materials are shown in Table 1, respectively.

TABLE 1

| Material | Thermal expansion coefficient CTE [ppm/K] | Thermal conductivity TC [W/m · K] |
|---|---|---|
| β-$Ga_2O_3$ | 7.0 | 0.23 |
| GaN | 6.0 | 2.0 |
| Si | 4.0 | 1.5 |
| SiC | 4.0 | 5.0 |

From the viewpoint of a mechanical strength of the semiconductor substrate SSB1, and increasing the handling property during manufacturing, a thickness of the base layer BL1 is preferably large. For example, the thickness of the base layer BL1 is preferably 50 μm or more, more preferably 60 μm or more. Further, from the viewpoint of increasing the heat dissipation of the semiconductor device SD1, the thickness of the base layer BL1 is preferably small. For example, the thickness of the base layer BL1 is preferably 100 μm or less, and more preferably 80 μm or less.

The base layer BL1 contains, for example, an n-type impurity. Examples of the type of the n-type impurity include silicon (Si) and tin (Sn). An impurity concentration of the substrate BL1 is, for example, $5 \times 10^{18}$ cm$^{-3}$ or more and $2 \times 10^{19}$ cm$^{-3}$ or less.

The epitaxial layer EP includes an edge termination layer ETL defining the position of the active region AR. The edge termination layer ETL relaxes an electric field concentration at an edge of a contact surface of the epitaxial layer EP and the top electrode TE. The edge termination layer ETL is formed such that the edge termination layer ETL surrounds the active region AR in plan view. The planar shape of the edge termination layer ETL is an annular shape in plan view.

The edge termination layer ETL contains, for example, a p-type impurity. Examples of types of p-type impurities include magnesium (Mg), beryllium (Be), zinc (Zn), nitrogen (N) and iron (Fe). An impurity concentration of the edge termination layer ETL, for example, $2 \times 10^{17}$ cm$^{-3}$ or more and $5 \times 10^{18}$ cm$^{-3}$ or less. The thickness of the epitaxial layer EP is, for example, 3 μm or more and 10 μm or less. Examples of the material of the epitaxial layer EP are similar to the material of the base layer BL1. The epitaxial layer EP also contains, for example, an n-type impurity. The impurity concentration of the epitaxial layer EP is smaller than the impurity concentration of the base layer BL. That is, the epitaxial layer EP is, for example, $1 \times 10^{15}$ cm$^{-3}$ or more and $5 \times 10^{17}$ cm$^{-3}$ or less.

The insulating layer IL is formed on the semiconductor substrate SSB1. A first pad opening POP1 for an electrode located in the active region AR is formed in insulating layer IL. An open end of the first pad opening POP1 is preferably located on the edge termination layer ETL. The thickness of insulating layer IL is, for example, 500 nm or more and 2 μm or less. The insulating layer IL is made of, for example, silicon oxide ($SiO_2$).

The top electrode TE is an anodic electrode (Schottky electrode) formed on the top surface TS1 of the semiconductor substrate SSB1. In the first embodiment, the top electrode TE directly contacts with the epitaxial layer EP of the semiconductor substrate SSB1 in the opening for the electrode of insulating layer IL to form a Schottky junction. The thickness of the top electrode TE is, for example, 0.1 μm or more and 1 μm or less. The materials of the insulating layer IL are, for example, a stacked film in which platinum (Pt), titanium (Ti), and gold (Au) are stacked in this order.

The thermal conductive film TCF1 transfers heat generated inside the semiconductor substrate SSB1 to the outside of the semiconductor substrate SSB. The thermal conductive film TCF1 is formed on the back surface BS1 of the semiconductor substrate SSB1 such that the thermal conductive film TCF1 is embedded in the first opening OP1 of semiconductor substrate SSB1. More specifically, the thermal conductive film TCF1 includes a first thermal conductive portion TCP11 formed in the first opening portion OP1, and a second thermal conductive portion TCP2 formed on the back surface BS1 of the semiconductor substrate SSB1. The first thermal conductive portion TCP11 and the second thermal conductive portion TCP12 may be formed integrally with each other as a single member or may be formed separately from each other. In the first embodiment, the first thermal conductive portion TCP11 and the second thermal conductive portion TCP12 are formed integrally with each other as a single member. Here, "integrally" means that the first thermal conductive portion TCP11 and the second thermal conductive portion TCP12 are formed in one step.

The first thermal conductive portion TCP11 is embedded in the first opening portion OP1 such that the void VD is formed in the first opening portion OP1. The size, shape, position and number of the first thermal conductive portion TCP11 can be appropriately adjusted according to the desired heat dissipation.

As shown in FIG. 3, a width w of the first thermal conductive portion TCP11 is a thickness of the first thermal conductive portion TCP11 in a cross section perpendicular to the thickness direction of the semiconductor substrate SSB1 and passing through the first thermal conductive portion TCP11. For example, the width w of the first thermal conductive portion TCP11 is a thickness of the portion of the first thermal conductive portion TCP11 in the cross section excluding the void VD.

From the viewpoint of preventing the occurrence of cracking due to thermal expansion coefficient differences, the width w of the first thermal conductive portion TCP11 is preferably small. For example, the width w of the first thermal conductive portion TCP11 is preferably a length of 90% of the radius of the first opening OP1 or less, and more preferably a length of 80% of the radius of the first opening OP1 or less. From the viewpoint of heat dissipation, it is preferable that the width w of the first thermal conductive portion TCP11 be large. For example, the width w of the first thermal conductive portion TCP11 is preferably a length of 20% of the radius of the first opening portion OP1 or more, and more preferably a length of 60% of the radius of the first opening portion OP1 or more.

A height of the first thermal conductive portion TCP11 may be appropriately adjusted in accordance with the thickness of semiconductor substrate SSB1 (the base layer BL1). The height of the first thermal conductive portion TCP11 is the length of the first thermal conductive portion TCP11 in the thickness direction of the semiconductor substrate SSB1.

The shape of the first thermal conductive portion TCP11 may be any shape as long as it can conduct the heat generated inside the semiconductor substrate SSB1 to the outside of the semiconductor substrate SSB. For example, the cross-sectional shape of the first thermal conductive portion TCP11, in a cross section perpendicular to the thickness direction of the semiconductor substrate SSB1, may be substantially circular, or may be substantially rectangular, may be substantially polygonal. That is, a stereoscopic shape of the first thermal conductive portion TCP11 in the cross section may be a substantially cylindrical shape, may be a substantially square prism shape, or may be a substantially polygonal prism shape. In the first embodiment, as shown in FIG. 3, the cross-sectional shape of the first thermal conductive portion TCP11 in the cross section is substantially circular.

The position of the first thermal conductive portion TCP11 is preferably in a vicinity of a region where heat is generated in the semiconductor device SD1. For example, the first thermal conductive portion TCP11 is preferably formed at a position overlapping with the top electrode TE in plan view. In other words, the first thermal conductive portion TCP11 is preferably formed in the active region AR surrounded by the edge termination layer ETL in a plan view.

The occupancy of the first thermal conductive portion TCP11 can be appropriately adjusted from the viewpoint of the desired heat dissipation. For example, in a cross section perpendicular to a thickness direction of the semiconductor substrate SSB1 and passing through the first thermal conductive portion TCP11, the occupation ratio of the first heat conduction portion TCP11 to the opening area of the first opening OP1 is preferably 50% or more.

The number of the first thermal conductive portion TCP11 may be appropriately adjusted in accordance with the size of the first thermal conductive portion TCP11. The number of the first thermal conductive portions TCP11 may be one or two or more. In the present embodiment, the number of the first thermal conductive portions TCP11 is nine or more. The plurality of first thermal conductive portions TCP11 are formed to be spaced apart from each other. In first embodiment, the nine first thermal conductive portion TCP11 is arranged in a grid shape in a cross section perpendicular to the thickness direction of semiconductor substrate SSB1. This allows the heat generated within the semiconductor substrate SSB1 to be evenly released without irregularities.

The second thermal conductive portion TCP12 is formed on the back surface BS1 of the semiconductor substrate SSB1. From the viewpoint of strain relaxation, it is preferable that the thickness of second thermal conductive portion TCP12 is small. From the viewpoint of enhancing the heat dissipation property, it is preferable that a thickness of the second thermal conductive portion TCP2 is large. For example, the thickness of second thermal conductive portion TCP2 is preferably 2 μm or more and 20 μm or less.

The thermal expansion coefficient of the material of the thermal conductive film TCF1 and the thermal expansion coefficient of the material of semiconductor substrate SSB1 differ from each other. The thermal expansion coefficient of the thermal conductive film TCF1 can be estimated by identifying the materials of the thermal conductive film TCF1 by elemental analysis. The thermal expansion coefficient of the thermal conductive film TCF1 can also be estimated by heating the semiconductor device SD1 and observing changes in area or volume of the thermal conductive film TCF1 using optical microscopy or SEM. The thermal expansion coefficient of the material of the semiconductor substrate SSB1 can also be estimated by the same method.

The thermal conductivity of the material of the thermal conductive film TCF1 is greater than the thermal conductivity of the material of the semiconductor substrate SSB1. As a result, the heat generated in the semiconductor substrate SSB1 is emitted to the outside of the semiconductor substrate SSB through the thermal conductive film TCF1. For example, the thermal conductivity of the material of the thermal conductive film TCF1 is preferable 10 times or more than the thermal conductivity of the material of the semiconductor substrate SSB1.

The thermal conductivity of the thermal conductive film TCF1 can be estimated from the materials of the thermal conductive film TCF1 specified by elemental analysis. The thermal conductivity of the thermal conductive film TCF1 can also be estimated by thermo-graphically measuring the thermal change when the semiconductor device SD1 is heated. The thermal conductivity of the materials of the semiconductor substrate SSB1 may also be estimated by the same method.

The thermal conductive film TCF1 may be a single layer film or a stacked film. The material of the thermal conductive film TCF1 is at least one material selected from the group consisting of aluminum (Al), aluminum oxide ($Al_2O_3$), aluminum nitride (AlN), gold (Au), silver (Ag), copper (Cu), molybdenum (Mo), tungsten (W), nickel (Ni), palladium (Pd), titanium (Ti), titanium nitride (TiN), tantalum (Ta), tantalum nitride (TaN), silicon nitride ($Si_3N_4$), and diamond (C). For example, the thermal conductive film TCF1 is a stacked film formed of a titanium film and an aluminum film formed on the titanium film. A thickness of the titanium film is, for example, 200 nm. A thickness of the aluminum film is, for example, 5 μm or more and 10 μm or less.

TABLE 2

| Material | Thermal expansion coefficient CTE [ppm/K] | thermal conductivity TC [W/m · K] |
|---|---|---|
| Al | 23.6 | 220 |
| $Al_2O_3$ | 6.7 | 30 |
| AlN | 4~5 | 130~190 |
| Au | 14.2 | 320 |
| Ag | 18.9 | 420 |
| Cu | 17 | 395 |
| Mo | 4.9 | 143 |
| W | 4.3 | 170 |
| Ni | 12.8 | 90.9 |
| Pd | 11.8 | 71.8 |
| Ti | 8.5 | 17 |
| TiN | 9.4 | 19.2 |
| Ta | 6~7 | 50~60 |
| TaN | — | 5~13 |
| $Si_3N_4$ | 2~3 | 60~90 |
| Diamond | 10 | 20 |

From the viewpoint of increasing the heat dissipation, the material of the thermal conductive film TCF1 is preferably a material having a high thermal conductivity. From this viewpoint, the materials of the thermal conductive film TCF1 are preferably aluminum or copper. From the viewpoint of increasing the crack resistance of the semiconductor substrate SSB1, it is preferable that the material is close to the thermal expansion coefficient of the material of the semiconductor substrate SSB1. For example, if the semiconductor substrate SSB1 is gallium oxide substrate, the material of the thermal conductive film TCF1 is preferably at least one selected from the group consisting of aluminum nitride, aluminum oxide, silicon nitride, tungsten and titanium nitride.

The void VD is formed in the first opening OP1. The void VD may be surrounded by an inner surface of the first opening OP1 and the first thermal conductive portion TCP11, or may be surrounded by only the first thermal conductive portion TCP11. In the first embodiment, the void VD is formed in the first opening OP1 such that the void VD is surrounded only by the first thermal conductive portion TCP11. The void VD may be formed in the first opening OP1. The void VD may be formed only in an upper portion (the top surface TS1 side of the semiconductor substrate SSB1) of the first opening OP1, may be formed only in a lower portion (the back surface BS1 side of the semiconductor substrate SSB1) of the first opening OP1, or may be formed only in a middle portion of the first opening OP1. The void VD may be formed over the upper portion, the middle portion, and the lower portion of the first opening OP1. In the first embodiment, the void VD is formed over the upper part, the middle part, and the lower part of the first opening OP1.

The back electrode BE is a cathode electrode formed on the back surface BS1 of the semiconductor substrate SSB1. In the first embodiment, the back electrode BE is formed on the back surface BS1 of the semiconductor substrate SSB1 through the second thermal conductive portion TCP2. The back electrode BE directly contacts with the second thermal conductive portion TCP2. A configuration of the back electrode BE is not particularly limited, a known configuration can be employed as a back electrode in the semiconductor technology. For example, the back electrode BE is a stacked film formed of a titanium (Ti) film and a gold (Au) film formed on the titanium film. A thickness of the titanium film is, for example, 100 nm. A thickness of the gold film is, for example, 400 nm.

A protective film PF is formed on the insulating layer IL. In the protective film PF, a second pad opening POP2 exposing a portion of the top electrode TE is formed, as shown in FIG. 1. The second pad opening POP2 communicates with the first pad opening POP1. The protective film PF is not particularly limited as long as the protective film PF can function as a film for protecting the semiconductor device SD1. The protective film PF is composed of polyimide, for example.

(Function of Void Vd)

Here, the function of the void VD in the semiconductor device SD1 will be described. In order to explain the function of the void VD, a semiconductor device (hereinafter also referred to as a "comparative semiconductor device") including the first thermal conductive portion TCP11 formed in the first opening OP1 such that the void VD is not formed will be described. When heat is generated during the drive of the comparative semiconductor device, the generated heat expands semiconductor substrate SSB1 and the thermal conductive film TCF1. In this instance, a degree of expansion of each element is determined in accordance with the material of each element. The material of the semiconductor substrate SSB1 differ from the material of the thermal conductive film TCF1. Therefore, inside the comparative semiconductor device, due to the difference in thermal expansion coefficients, stresses occur. This may cause the semiconductor substrate SSB1 to crack or warp. This results in crystalline defects in the semiconductor substrate SSB1 and increased leakage current. Also, elements of different materials may peel off from each other.

On the other hand, in the semiconductor device SDs1 according to the first embodiment, as shown in FIG. 2, the first thermal conductive portion TCP11 constituting a part of the heat dissipation path is embedded in the first opening OP1 such that the void VD is formed in the first opening OP1 of the semiconductor substrate SSB1. Therefore, even if the stress is generated in the semiconductor device SD1, the void VD relaxes the stress. As a result, in the semiconductor substrate SSB1, the generation of crystalline defects caused by the distortion of the semiconductor substrate SSB1 is suppressed, such that the increase of the leakage current can be suppressed. Also, peel between elements having different materials can be suppressed.

(Method of Manufacturing Semiconductor Device)

Next, an exemplary method of manufacturing the semiconductor device SD1 according to the first embodiment will be described. FIGS. 4 to 16 are cross sectional views showing exemplary steps included in the method of manufacturing the semiconductor device SD1.

The method of manufacturing the semiconductor device SD according to the first embodiment includes (1) providing a semiconductor substrate SSB1, (2) forming an edge termination layer ETL; (3) disposing a first support member SM1; (4) grinding the semiconductor substrate SSB1, (5) forming a first opening OP1; (6) forming a thermal conductive film TCF1; (7) forming a back electrode BE; (8) disposing a second support member SM2; (9) removing the first support member SM1; (10) forming an insulating layer IL; (11) forming a top electrode TE; (12) forming a protective film PF; and (13) removing the second support member SM2.

(1) Providing a Semiconductor Substrate SSB1

Figure 4:
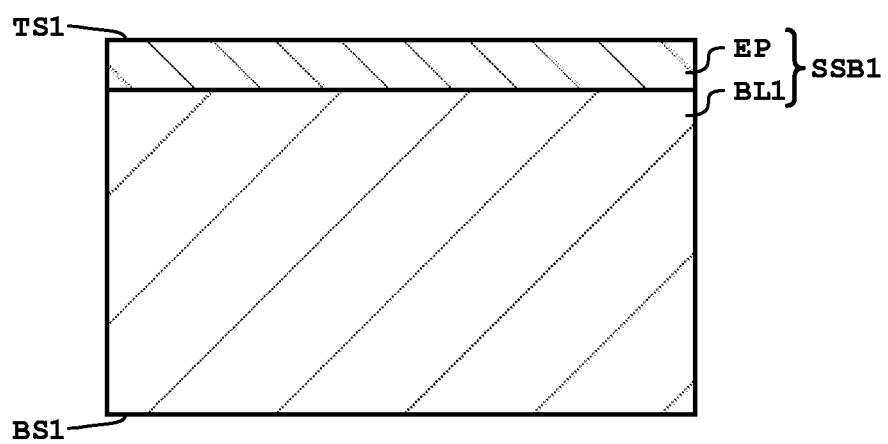
FIG. 4 is a cross-sectional view showing an exemplary step included in a method of manufacturing the semiconductor device according to the first embodiment.

First, as shown in FIG. 4, a semiconductor substrate SSB1 having a top surface TS1 and a back surface BS1 is provided. In the first embodiment, the semiconductor substrate SSB1 is an n-type semiconductor substrate. First, a base layer BL1 having a thickness of 600 μm is provided. The base layer BL1 contains an impurity doped by ion implantation. Subsequently, an epitaxial layer EP containing the impurity is formed on the top surface TS1 of the base layer BL1 by an epitaxial method.

(2) Forming an Edge Termination Layer ETL

Figure 5:
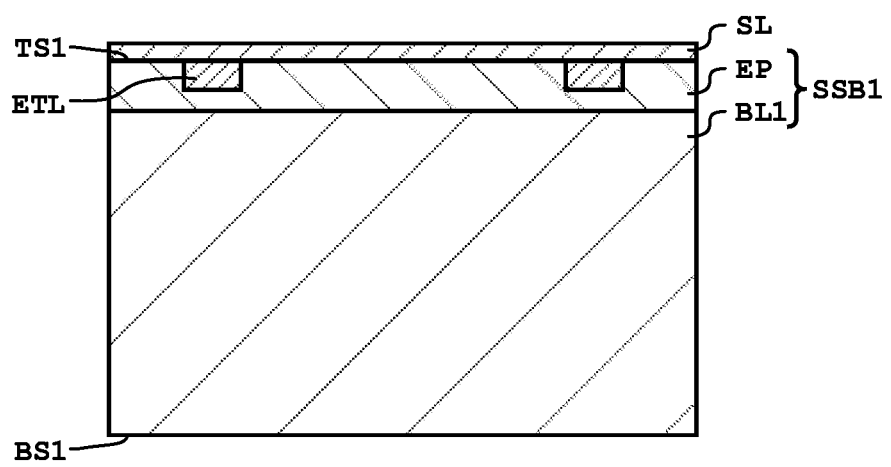
FIG. 5 is a cross-sectional view showing an exemplary step included in the method of manufacturing the semiconductor device according to the first embodiment.

Subsequently, as shown in FIG. 5, an edge termination layer ETL is formed on the epitaxial layer EP. The edge termination layer ETL is a p-type semiconductor layer. First, from the viewpoint of protecting the epitaxial layer EP from damage caused by ion implantation, it is preferable to form a sacrificing layer SL on the epitaxial layer EP in advance. The sacrificing layer SL is formed by, for example, a CVD method. The sacrificing layer SL is, for example, a silicone-dioxide ($SiO_2$) film having a thickness of 100 nm.

Subsequently, impurities are implanted into a desired region of the semiconductor substrate SSB1 by photolithography and ion implantation method, and then annealing is performed to form edge termination layer ETL. The implantation energy is, for example, 560 keV. A dose is, for example, $1\times10^{14}$ $cm^{-2}$. The annealing temperature is, for example, 600° C. or more and 800° C. or less.

(3) Disposing a First Support Member SM1

Figure 6:
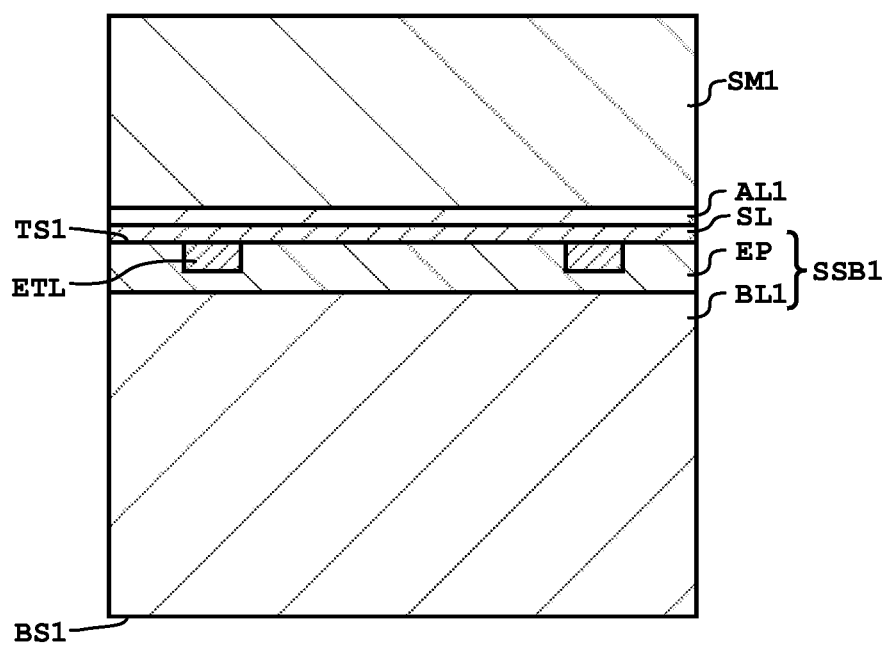
FIG. 6 is a cross-sectional view showing an exemplary step included in the method of manufacturing the semiconductor device according to the first embodiment.

Subsequently, as shown in FIG. 6, a first support member SM1 through the sacrificing layer SL is disposed on the semiconductor substrate SSB. For example, after the first adhesive layer AL1 is formed on the sacrificing layer SL, a glass substrate is laminated as the first supporting member SM1 on the UV-curable double-sided tape, which is the first adhesive layer AL1. A laminating method is, for example, a vacuum heating pressure laminating method. The first adhesive layer AL1 is, for example, a tape having a thickness of 5 μm or more and 100 μm or less, and an acrylic adhesive layer formed on both surfaces of a polyolefin film as a main material. The first support member SM1 is, for example, a glass film having a thickness of 600 μm or more and 800 μm or less.

(4) Grinding Semiconductor Substrate SSB

Figure 7:
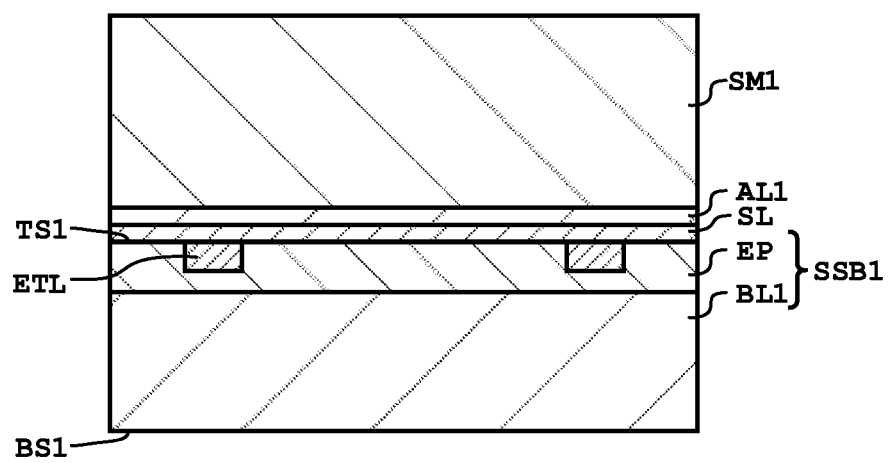
FIG. 7 is a cross-sectional view showing an exemplary step included in the method of manufacturing the semiconductor device according to the first embodiment.

Subsequently, as shown in FIG. 7, the back surface BS1 of the semiconductor substrate SSB1 is ground. This adjusts the thickness of the semiconductor substrate SSB1 to the desired thickness. The grinding method of the semiconductor substrate SSB1 is, for example, an in-feed method. Specifically, the grinding method is, in a state of disposing a wafer on a so-called rotating chuck, a method of grinding a surface of the wafer to a predetermined thickness. As described above, the semiconductor substrate SSB1 is ground to have a thickness of 50 μm or more and 100 μm or less, for example.

(5) Forming a First Opening OP1

Figure 8:
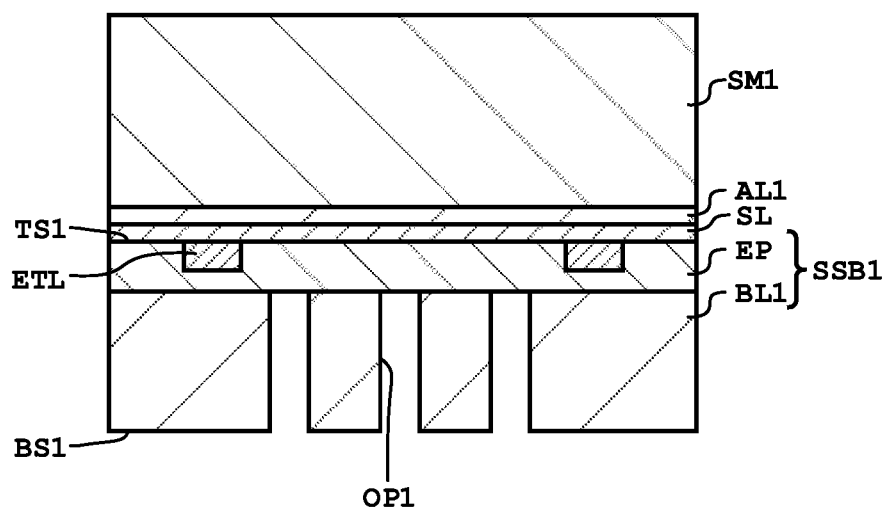
FIG. 8 is a cross-sectional view showing an exemplary step included in the method of manufacturing the semiconductor device according to the first embodiment.

Next, as shown in FIG. 8, a first opening OP1 is formed on the back surface BS1 of the semiconductor substrate SSB1. Specifically, the first opening OP1 may be formed by photolithography method with a photoresist mask formed on the back surface BS1 of the semiconductor substrate SSB1. A method of forming the first opening OP1 is, for example, a RIE (Reactive Ion Etching) method using $BCl_3$ gases.

(6) Forming a Thermal Conductive Film TCF

Figure 9:
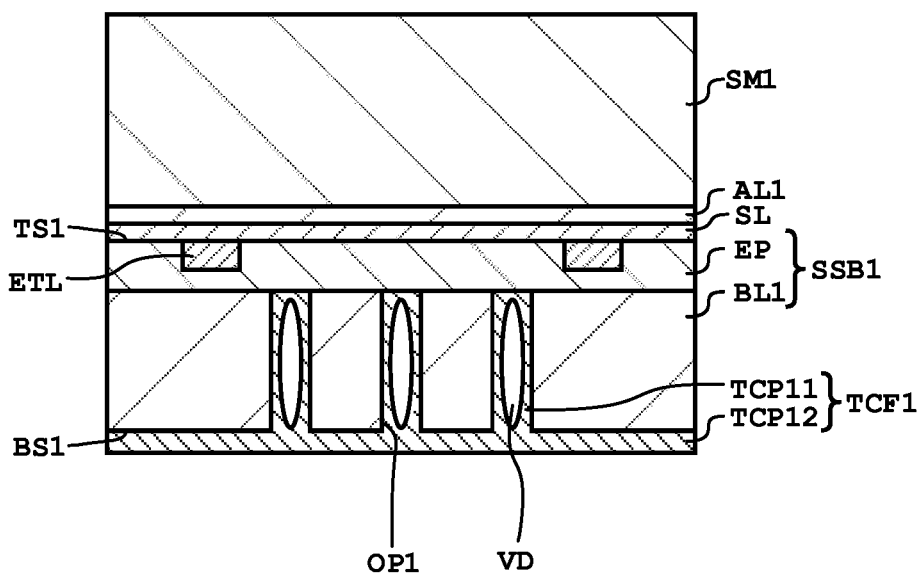
FIG. 9 is a cross-sectional view showing an exemplary step included in the method of manufacturing the semiconductor device according to the first embodiment.

Subsequently, as shown in FIG. 9, a thermal conductive film TCF1 is formed in the first opening OP1 such that the void VD is formed in the first opening OP1. For example, after forming a titanium film having a thickness of 200 nm on an inner surface of the first opening OP1, by forming an aluminum film having a thickness of 5 μm or more and 10 μm or less on the titanium film, it is possible to form the thermal conductive film TCF. The method of forming the titanium film and the aluminum film is, for example, a sputtering method.

(7) Forming a Back Electrode BE

Figure 10:
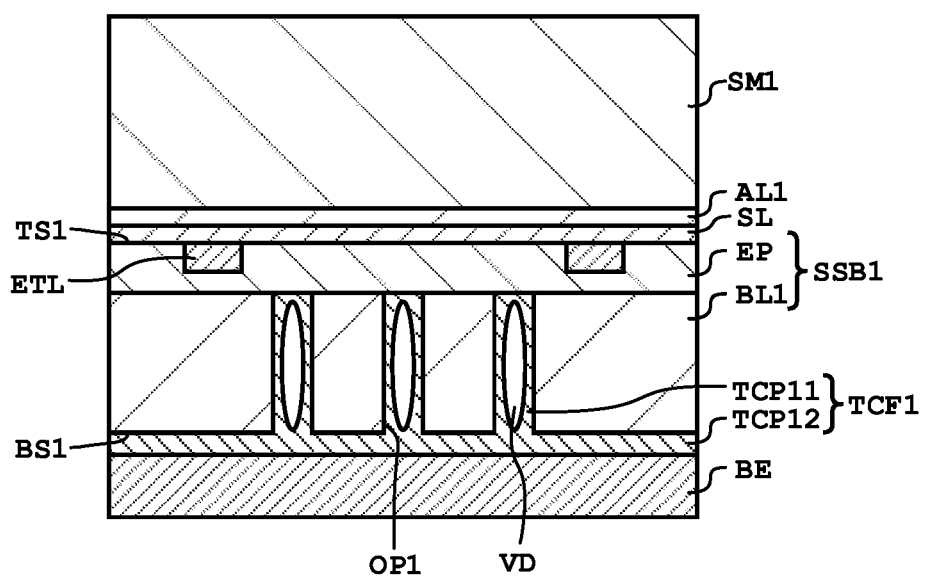
FIG. 10 is a cross-sectional view showing an exemplary step included in the method of manufacturing the semiconductor device according to the first embodiment.

Subsequently, as shown in FIG. 10, a back electrode BE is formed on the back surface BS1 of the semiconductor substrate SSB1 through the second thermal conductive portion TCP2 of the thermal conductive film TCF1. A method of forming the back electrode BE, for example, a sputtering method.

(8) Disposing a Second Support Member SM2

Figure 11:
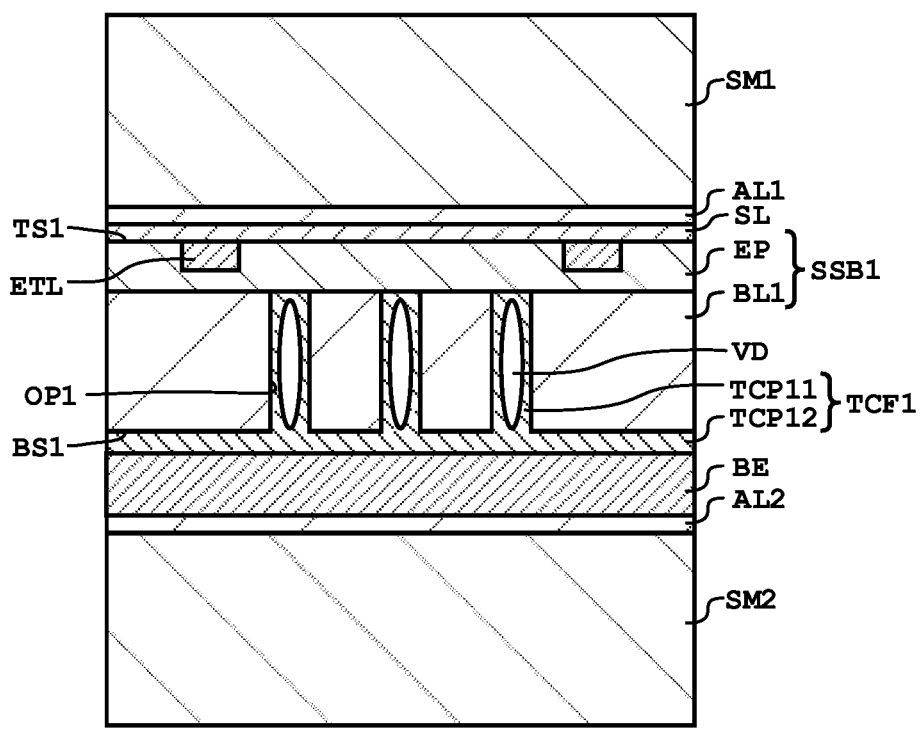
FIG. 11 is a cross-sectional view showing an exemplary step included in the method of manufacturing the semiconductor device according to the first embodiment.

Subsequently, as shown in FIG. 11, a second support member SM2 is disposed on the back electrode BE. Specifically, after a second adhesive layer AL2 is formed on the back electrode BE, the second support member SM2 is disposed on the second adhesive layer AL2. The second adhesive layer AL2 and the second support member SM2 may be formed in the same manner as the first adhesive layer AL1 and the first support member SM1.

(9) Removing the First Support Member SM1

Figure 12:
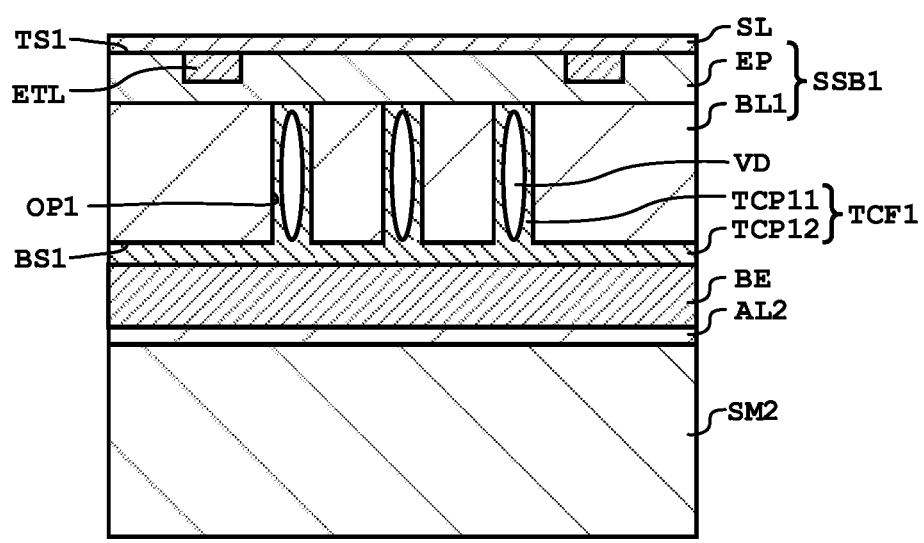
FIG. 12 is a cross-sectional view showing an exemplary step included in the method of manufacturing the semiconductor device according to the first embodiment.

Subsequently, as shown in FIG. 12, the first adhesive layers AL1 and the first support member SM1 are removed from the semiconductor substrate SSB. For example, an ultraviolet ray is irradiated from the glass support side to weaken the adhesive strength of the UV-curable double-sided tape of the first adhesive layer AL1. As a result, the first adhesive layer AL1 and the first support member SM1 are separated from the semiconductor substrate SSB.

(10) Forming an Insulating Layer IL

Figure 13:
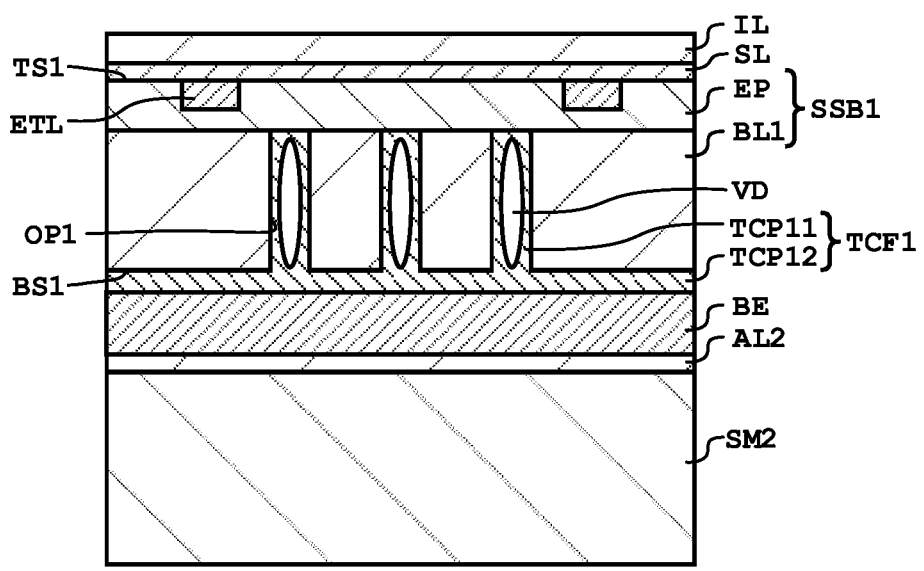
FIG. 13 is a cross-sectional view showing an exemplary step included in the method of manufacturing the semiconductor device according to the first embodiment.

Subsequently, an insulating layer IL is formed on the semiconductor substrate SSB1 as shown in FIG. 13. Specifically, after the sacrificing layer SL is removed, the insulating layer IL is formed on the semiconductor substrate SSB1. A portion of the sacrificing layer SL may be removed, or an entire of the sacrificing layer SL may be removed. The sacrificing layer SL is removed by, for example, a wet etching method using HBF (buffered hydrofluoric acid). A method of forming the insulating layer ILs is, for example, a LP-CVD (Low Pressure CVD) method.

(11) Formation a Top Electrode TE

Figure 14:
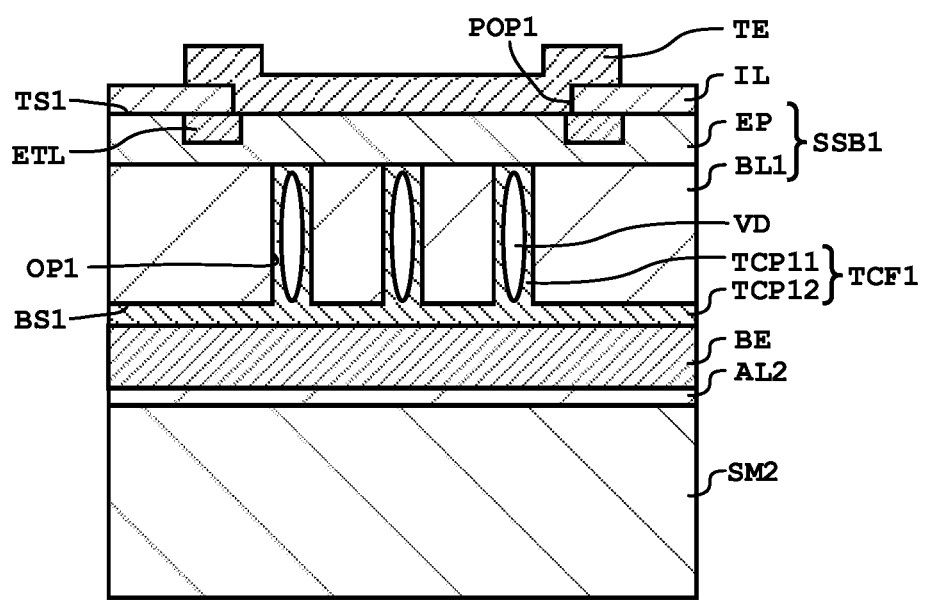
FIG. 14 is a cross-sectional view showing an exemplary step included in the method of manufacturing the semiconductor device according to the first embodiment.

Subsequently, a top electrode TE is formed on the top surface TS1 of the semiconductor substrate SSB1 as shown in FIG. 14. Specifically, by a photolithography method, a first pad opening POP1 is formed while a photoresist mask is formed on the insulating layer IL. The method of forming the first opening POP1 is, for example, a RIE method using a fluorocarbon gas. Subsequently, the photoresist mask is removed. Subsequently, a gold film is formed on the titanium film after a titanium film is formed on the top surface TS1 of semiconductor substrate SSB1 and the insulating layer IL. Finally, the titanium film and the gold film are patterned by photolithography method and dry etching method to form the top electrode TE.

(12) Forming a Protective Film PF

Figure 15:
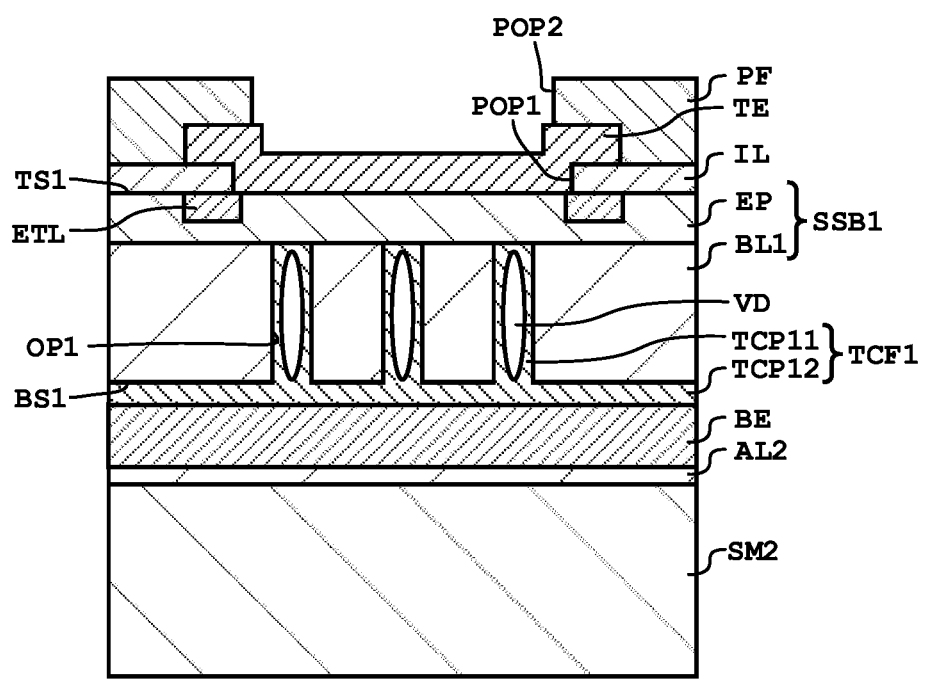
FIG. 15 is a cross-sectional view showing an exemplary step included in the method of manufacturing the semiconductor device according to the first embodiment.

Subsequently, as shown in FIG. 15, a protective film PF is formed on the insulating layer IL. First, a polyimide film is formed on the top electrode TE and the insulating layer IL. Subsequently, a second opening POP2 communicating with the first pad opening POP1 is formed in the polyimide film by a photolithography method and a dry etch method to form the protective film PF.

(13) Removing the Second Support Member SM2

Figure 16:
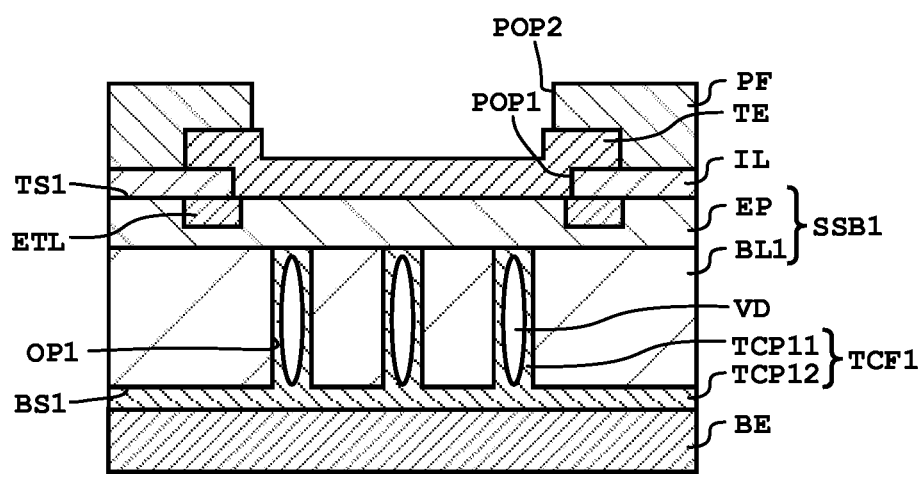
FIG. 16 is a cross-sectional view showing an exemplary step included in the method of manufacturing the semiconductor device according to the first embodiment.

Subsequently, as shown in FIG. 16, the second adhesive layer AL2 and the second support member SM2 are removed from the semiconductor substrate SSB. For example, an UV light is irradiated from the glass support side to weaken the adhesiveness. As a result, the second adhesive layer AL2 and the second support member SM2 are peeled off from the semiconductor substrate SSB.

The semiconductor device SD1 according to the first embodiment can be manufactured by the manufacturing method.

(Function of Void VD)

Here, the function of the void VD in method of manufacturing the semiconductor device SD1 will be described. The first thermal conductive portion TCP11 constituting the heat dissipation path is embedded in the first opening portion OP1 such that the void VD is formed in the first opening portion OP1 of the semiconductor substrate SSB1. As previously described, the void VD can relieve stresses applied within the semiconductor substrate SSB1. Therefore, when heat is applied to the semiconductor substrate SSB after the forming the thermal conductive film TCF1, warping or cracking of the semiconductor substrate SSB1 is suppressed. Also, peel between elements having different materials is suppressed.

(Effect)

As described above, in first embodiment SSB 1, stresses generated in semiconductor substrate SSB1 are relieved by the voids V D formed in the first opening OP1 of semiconductor substrate SSB. During both driving and manufacturing of semiconductor device SD 1, distortion of semiconductor substrate SSB1 is suppressed. Therefore, distortion of the semiconductor substrate SSB1 is suppressed, it is possible to suppress the generation of crystalline defects due to the distortion. As a result, the increase in leakage current in the semiconductor device SD1 is suppressed. That is, according to the first embodiment, the characteristics of semiconductor device SD1 can be enhanced.

FIRST MODIFICATION OF FIRST EMBODIMENT

Figure 17:
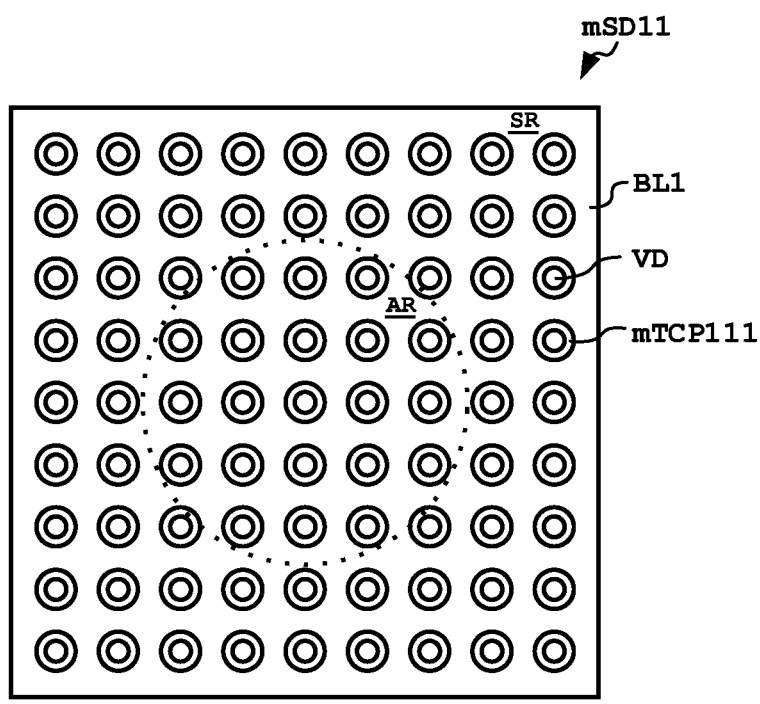
FIG. 17 is a cross-sectional view showing an exemplary configuration of a main portion of a semiconductor device according to a first modification of the first embodiment.

FIG. 17 is a cross-sectional view showing an exemplary configuration of a main portion of a semiconductor device mSD11 according to a first modification of first embodiment. FIG. 17 corresponds to FIG. 3 and shows a cross-sectional view of the main portion of the semiconductor device mSD11 in cross section perpendicular to the thickness direction of the semiconductor substrate SSB1 and passing through the first thermal conductive portion mTCP111.

As shown in FIG. 17, the first thermal conductive portion mTCP111 may be formed in both the active region AR and the peripheral region SR in plan view. In other words, the first thermal conductive portion mTCP111 may be formed substantially uniformly over an entire of the semiconductor substrate SSB1 in plan view. The formation of both the active region AR and the peripheral region SR is preferable from the viewpoint of further enhancing the heat dissipation property because the heat dissipation property from the active region AR to the periphery is also improved.

SECOND MODIFICATION OF FIRST EMBODIMENT

Figure 18:
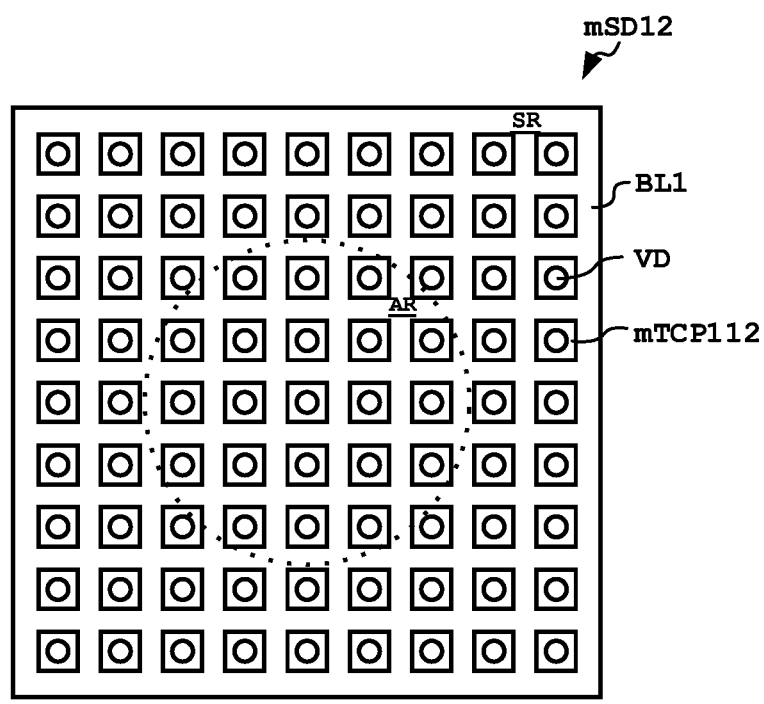
FIG. 18 is a cross-sectional view showing an exemplary configuration of a main portion of a semiconductor device according to a second modification of the first embodiment.

FIG. 18 is a cross-sectional view showing an exemplary configuration of a main portion of a semiconductor device mSD12 second according to a modification of the first embodiment. FIG. 18 corresponds to FIG. 3, and shows a cross-sectional view of a main portion of the semiconductor device mSD12 in a cross section perpendicular to the thickness direction of the semiconductor substrate SSB1 and passing through the first thermal conductive portion mTCP112.

As shown in FIG. 18, the cross-sectional shape of the first thermal conductive portion mTCP112 in the cross section is substantially square shape. That is, the stereoscopic shape of the first thermal conductive portion mTCP112 is a substantially rectangular prism shape. By the cross-sectional shape of the first thermal conductive portion mTCP112 is substantially square shape, it is preferable from the viewpoint of uniform stress relaxation. The "substantially square shape" does not necessarily mean that an angle of the corner portion of the first thermal conductive portion mTCP112 is a right angle. That is, for manufacturing reasons, the corner portion may have a substantially arc shape.

THIRD MODIFICATION OF FIRST EMBODIMENT

Figure 19:
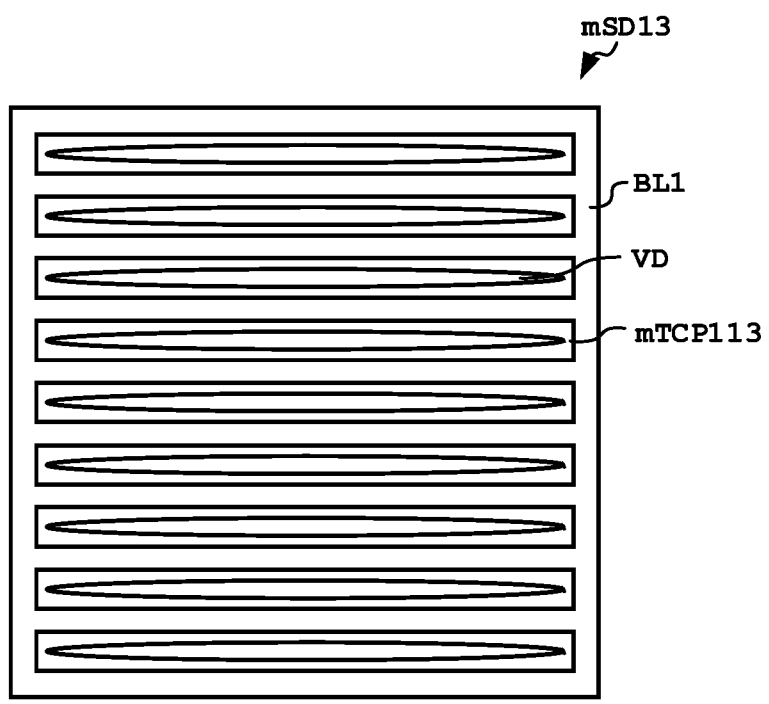
FIG. 19 is a cross-sectional view showing an exemplary configuration of a main portion of a semiconductor device according to a third modification of the first embodiment.

FIG. 19 is a cross-sectional view showing an exemplary configuration of a main portion of a semiconductor device mSD13 according to a third modification of the first embodiment. FIG. 19 corresponds to FIG. 3, and shows a cross-sectional view of the main portion of the semiconductor device mSD13 in a cross section perpendicular to the thickness direction of the semiconductor substrate SSB1 and passing through the first thermal conductive portion mTCP113.

As shown in FIG. 19, the cross-sectional shape of the first thermal conductive portion mTCP113 in the cross section is a rectangular shape. That is, the stereoscopic shape of the first thermal conductive portion mTCP113 is a plate shape. The semiconductor device mSD13 according to the first modification includes a plurality of the first thermal conductive portions mTCP113. The plurality of first thermal conductive portions mTCP113 are arranged in parallel with each other in the cross section. It is preferable that a cross-sectional shape of the first thermal conductive portion mTCP113 is a rectangular shape from the viewpoint of relaxation of efficient stresses.

FOURTH MODIFICATION OF FIRST EMBODIMENT

Figure 20:
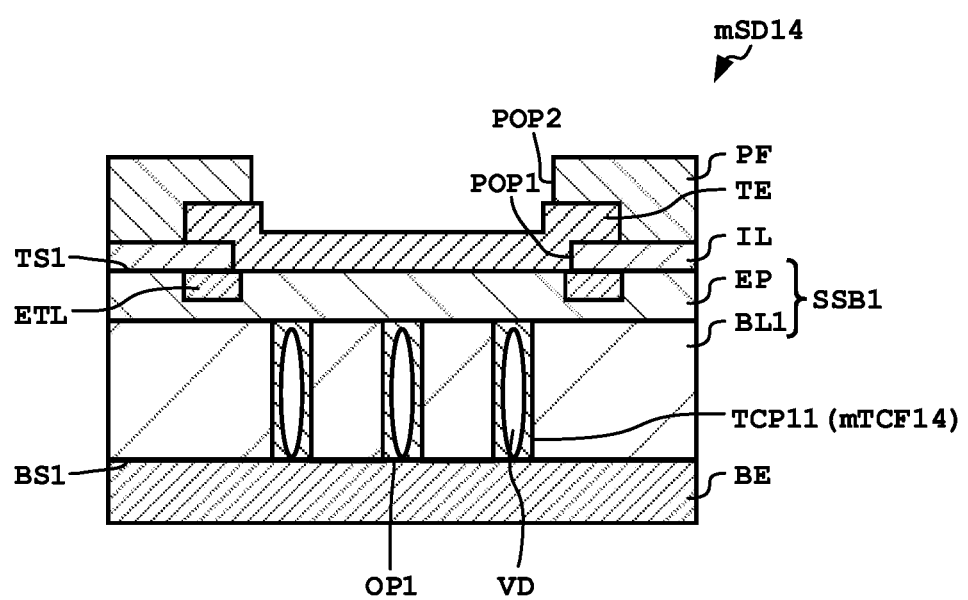
FIG. 20 is a cross-sectional view showing an exemplary configuration of a main portion of a semiconductor device according to a fourth modification of the first embodiment.

FIG. 20 is a cross-sectional view showing an exemplary configuration of a main portion of a semiconductor device mSD14 according to the fourth modification of the first embodiment.

As shown in FIG. 20, in the fourth modification, the thermal conductive film mTCF14 may be composed of only the first thermal conductive portion TCP11. That is, the thermal conductive film mTCF14 may not include the second thermal conductive portion TCP2 formed on the back surface BS1 of the semiconductor substrate SSB1. A thermal conductive film mTCF14 according to a fourth modification can be formed by polishing and removing a portion of a stacked film of the titanium film and aluminum film located on the back surface BS1 of the semiconductor substrate SSB1 by the CMP method. Thus, the back electrode BE can directly contact with the portion excluding the first opening OP1 among the semiconductor substrate SSB1. In this manner, it is preferable that the back surface BS1 of the semiconductor substrate SSB1 directly contacts with the back electrode BE from the viewpoint of increasing the adhesion strength of the semiconductor substrate SSB1 and the back electrode BE.

FIFTH MODIFICATION OF FIRST EMBODIMENT

Figure 21:
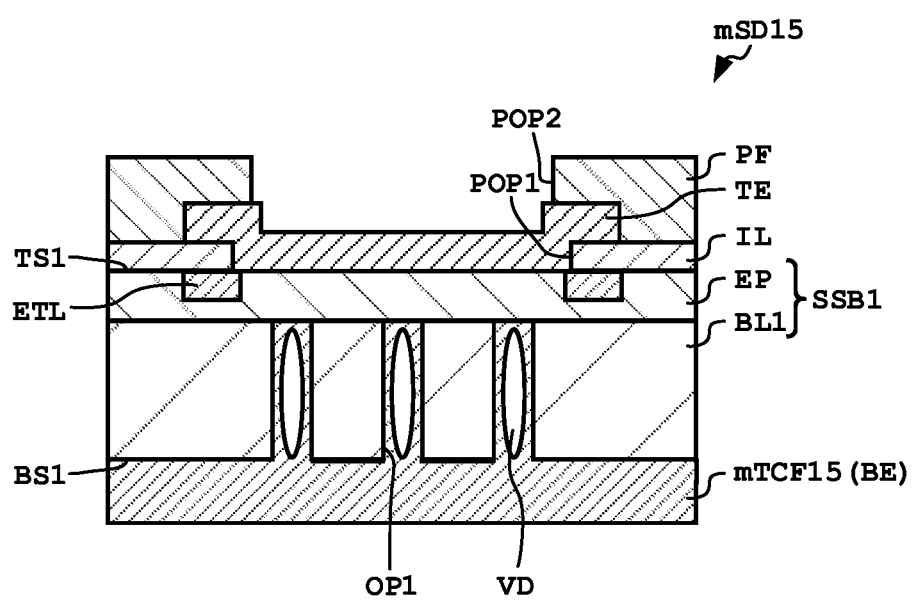
FIG. 21 is a cross-sectional view showing an exemplary configuration of a main portion of a semiconductor device according to a fifth modification of the first embodiment.

FIG. 21 is a cross-sectional view showing an exemplary configuration of a main portion of a semiconductor device mSD15 according to a fifth modification of the first embodiment.

As shown in FIG. 21, in the semiconductor device mSD15 according to the fifth modification, the thermal conductive film mTCF15 is integrated with the back electrode BE as a single member. That is, semiconductor device mSD15 also function as the back electrode BE. The material of the thermal conductive film mTCF15 is the same as the material of the back electrode BE. It is preferable that the thermal conductive film mTCF15 is integrated with the back electrode BE from the viewpoint of reducing the number of steps, that is, costs.

SECOND EMBODIMENT

Figure 22:
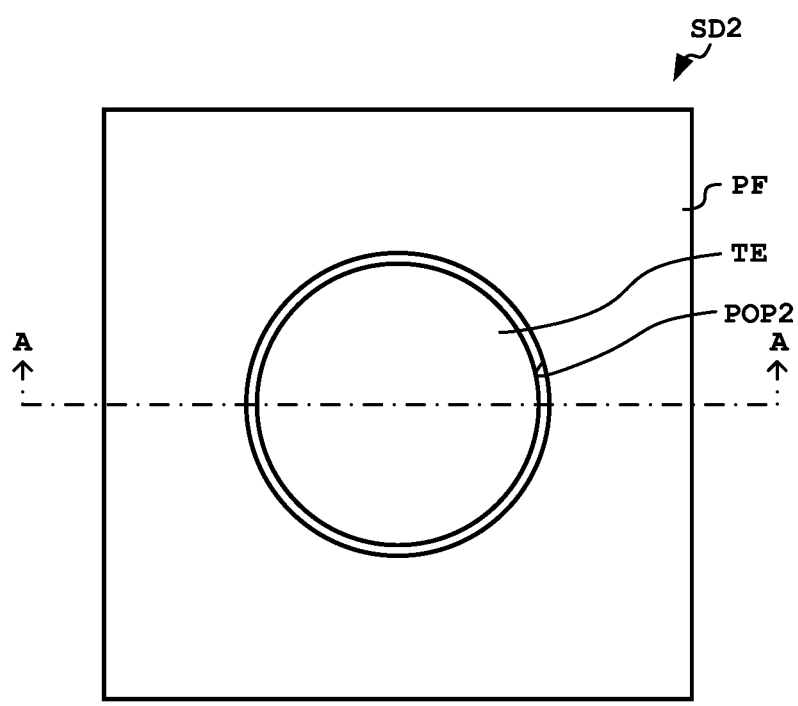
FIG. 22 is a plan view showing an exemplary configuration of a semiconductor device according to a second embodiment.
Figure 23:
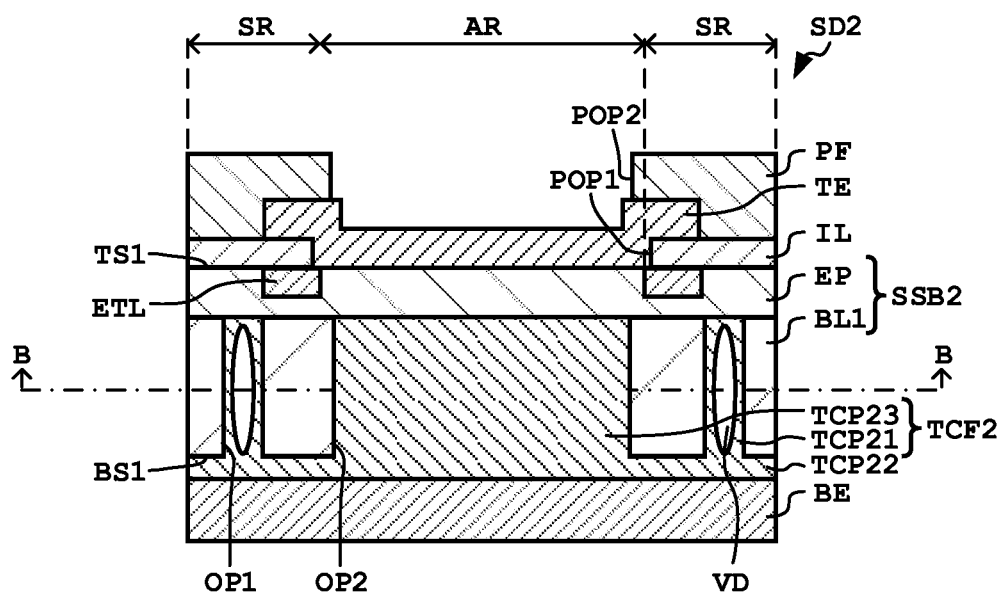
FIG. 23 is a cross-sectional view of the semiconductor device taken along line A-A of FIG. 22.

As shown in FIGS. 22 and 23, a semiconductor device SD2 according to a second embodiment includes a semiconductor substrate SSB2 in which a first opening OP1 and a second opening OP2 are formed. A thermal conductive film TCF2 for heat dissipation is formed such that a void VD is formed inside the first opening OP1, and such that the void is not formed inside the second opening OP2.

The semiconductor device SD2 according to the second embodiment differs from the semiconductor device SD1 according to the first embodiment mainly in that the semiconductor device SD2 includes a semiconductor substrate SSB2 in which the second opening OP2 is formed. Therefore, the same constituent elements as those of the semiconductor device SD1 according to the first embodiment are denoted by the same reference numerals, and descriptions thereof are omitted.

(Configuration of Semiconductor Device)

Figure 24:
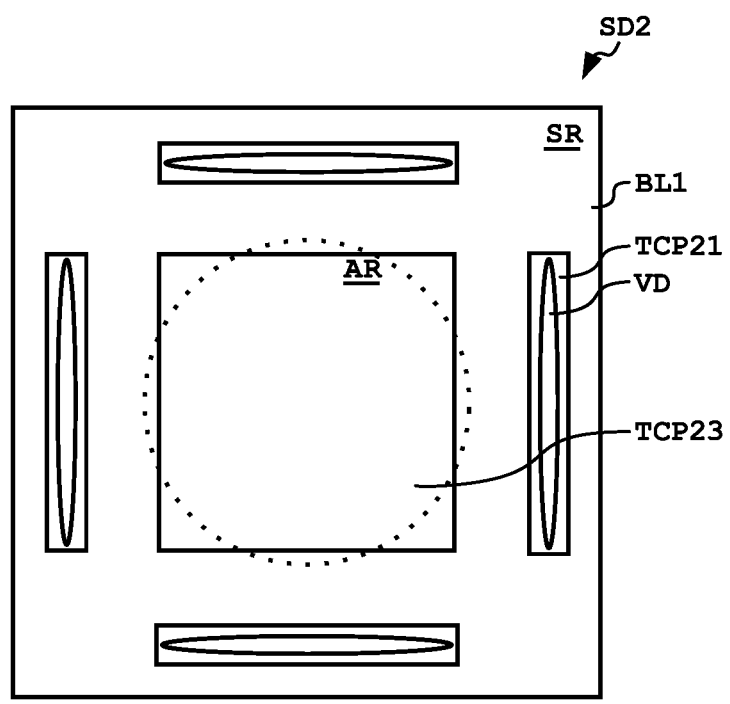
FIG. 24 is a cross-sectional view of the semiconductor device taken along line B-B of FIG. 23.

FIG. 22 is a plan view showing an exemplary configuration of the semiconductor device SD2 according to the second embodiment. FIG. 23 is a cross-sectional view showing the semiconductor device SD2 taken along line A-A of FIG. 22. FIG. 24 is a cross-sectional view showing semiconductor device SD2 taken along line B-B of FIG. 23.

As shown in FIG. 23, the semiconductor device SD2 includes a semiconductor substrate SSB2, an insulating layer IL, a top electrode TE, a thermal conductive film TCF2, a back electrode BE, and a protective film PF.

The semiconductor substrate SSB2 includes a base layer BL1 located on the back surface BS1 side and an epitaxial layer EP located on the top surface TS1 side. The first opening OP1 and the second opening OP2 are formed on the back surface BS of the semiconductor substrate SSB2 according to the second embodiment.

A bottom surface of the second opening OP2 may be located in the base layer BL1 or in the epitaxial layer EP. Like the first opening OP1, the second opening OP2 is also preferably formed such that a distance between the bottom surface of the second opening OP2 and the top surface TS1 of semiconductor substrate SSB2 is 3 μm or more and 10 μm or less. In the second embodiment, the bottom surface of the second opening OP2 is located in the base layer BL1. More specifically, the bottom surface of the second opening OP2 is located at the interface of the base layer BL1 and the epitaxial layer EP. A bottom portion of the second opening OP2, the epitaxial layer EP is exposed.

Inside the second opening OP2, a third thermal conductive portion TCP3, which is a portion of the thermal conductive film TCF2, is embedded without a void does formed. The second opening OP2 defines the size, shape, position and number of third thermal conductive portion TCP3. The size, shape, position and number of second opening OP2 can also be appropriately adjusted in accordance with the desired heat dissipation obtained by the thermal conductive film TCF2.

An aspect ratio of the second opening OP2 is preferably 2 or less, and more preferably 1 or less, from the viewpoint of suppressing voids from being formed inside the second opening OP2.

The thermal conductive film TCF2 transfers heat generated in the semiconductor substrate SSB2 to the outside of the semiconductor substrate SSB2. The thermal conductive film TCF2 is formed on the back surface BS1 of the semiconductor substrate SSB2 such that the thermal conductive film TCF2 is embedded in the first opening OP1 and the second opening OP2 of the semiconductor substrate SSB2. The thermal conductive film TCF2 includes a first thermal conductive portion TCP21, a second thermal conductive portion TCP22, and a third thermal conductive portion TCP23 formed in the second opening OP2. In second embodiment, the first heat conduction part TCP21, second heat conduction part TCP22 and third heat conduction part TCP23 are formed integrally with each other.

In the second embodiment, the first thermal conductive portion TCP21 is formed in a peripheral region SR formed in the periphery of the active region AR. The cross-sectional shape of the first thermal conductive portion TCP21 is a substantially rectangular shape. The number of the first thermal conductive portions TCP21 is four. In the cross section, the four first thermal conductive portions TCP21 are formed such that each of the four first thermal conductive portions TCP21 opposes the four sides constituting an outer edge of the semiconductor device SD2. In other words, in the cross section, the four first thermal conductive portions TCP21 are formed such that the four first thermal conductive portions TCP21 surrounds the third thermal conductive portion TCP23. Thus, relaxation and stress relaxation of uniform thermal conductivity can.

The third thermal conductive portion TCP23 is embedded in the second opening OP2 without a void formed in the second opening OP2. The size, shape, position and number of third thermal conductive portion TCP23 can be appropriately adjusted in accordance with the desired heat dissipation.

A width of third thermal conductive portion TCP23 can be appropriately adjusted from the viewpoint of heat dissipation. The definition of the width of third thermal conductive portion TCP23 is the same as the definition of the width of the first thermal conductive portion TCP21. The width of third thermal conductive portion TCP23 may be appropriately adjusted in accordance with the sizes of the active region AR. As shown in FIG. 22, the size (cross-sectional area) of the third thermal conductive portion TCP23 is preferably greater than the size (cross-sectional area) of the first thermal conductive portion TCP21. Thus, it is possible to further enhance the heat dissipation of the semiconductor device SD2.

A height of the third thermal conductive portion TCP23 can be appropriately adjusted in accordance with a thickness of the semiconductor substrate SSB2 (the base layer BL). Here, the height of the third thermal conductive portion TCP21 is a length of the third thermal conductive portion TCP23 in the thickness direction of the semiconductor substrate SSB. The height of the thermal conductive portion TCP23 and the height of the first thermal conductive portion TCP21 may be the same or different from each other. In the second embodiment, the height of third thermal conductive portion TCP23 and the height of the first thermal conductive portion TCP21 are the same.

The shape of third thermal conductive portion TCP23 is not particularly limited. For example, the cross-sectional shape of third thermal conductive portion TCP23 may be a substantially circular shape, a substantially rectangular shape, or a substantially polygonal shape in the cross section. In the second embodiment, as shown in FIG. 24, the cross-sectional view of the third thermal conductive portion TCP23 in the cross section is substantially rectangular.

The position of the third thermal conductive portion TCP23 is preferably within the active region AR where heat is generated in the semiconductor device SD2. In the second embodiment, as shown in FIG. 24, the third thermal conductive portion TCP23 is formed such that the third thermal conductive portion TCP23 overlaps with the active region AR and an inner edge of the peripheral area SR in plan view. Further, the third thermal conductive portion TCP23, in plan view, is preferably formed at a position overlapping with the top electrode TE.

An occupancy of the thermal conductive portion TCP23 can be appropriately adjusted from the viewpoint of desired heat dissipation. In the second embodiment, as described above, the third thermal conductive portion TCP23 is embedded in the second opening OP2 without a void formed in the second opening OP2. Therefore, in cross section perpendicular to the thickness direction of the semiconductor substrate SSB2 and passing through the third thermal conductive portion TCP23, the occupancy of the third thermal conductive portion TCP23 with respect to the opening area of the second opening OP2 is approximately 100%.

The number of the third thermal conductive portion TCP23 can be appropriately adjusted in accordance with the size of the third thermal conductive portion TCP23. The number of the third thermal conductive portion TCP23 may be one or two or more. In the second embodiment, the number of the third thermal conductive portion TCP23 is one.

Note that method of manufacturing the semiconductor device SD2 the according to the second embodiment is the same as the semiconductor device SD1 according to the first embodiment except that the size of the first opening OP1 and the size of the second opening OP2 are adjusted such that the void VD is formed in the first opening OP1 without the void formed in the second opening OP2.

(Effect)

Also, in the semiconductor device SD2 according to the second embodiment, the first thermal conductive portion TCP21 of the thermal conductive film TCF2 is formed such that the void VD is formed in the first opening OP1 of the semiconductor substrate SSB2. Therefore, the second embodiment has similar effects as the first embodiment. In the semiconductor device SD2 according to the second embodiment, the third thermal conductive portion TCP23 of the thermal conductive film TCF2 is formed such that a void is formed in the second opening OP2 of the semiconductor substrate SSB2. Therefore, as compared with the first thermal conductive portion TCP21, the third thermal conductive portion TCP23 can efficiently emit heat to the outside of the semiconductor substrate SSB2. The third thermal conductive portion TCP23 is disposed in the active region AR where heat is mainly generated in the semiconductor device SD2. As a result, in the second embodiment, heat generated in the semiconductor substrate SSB2 is more effectively conveyed to the outside.

FIRST MODIFICATION OF SECOND EMBODIMENT

Figure 25:
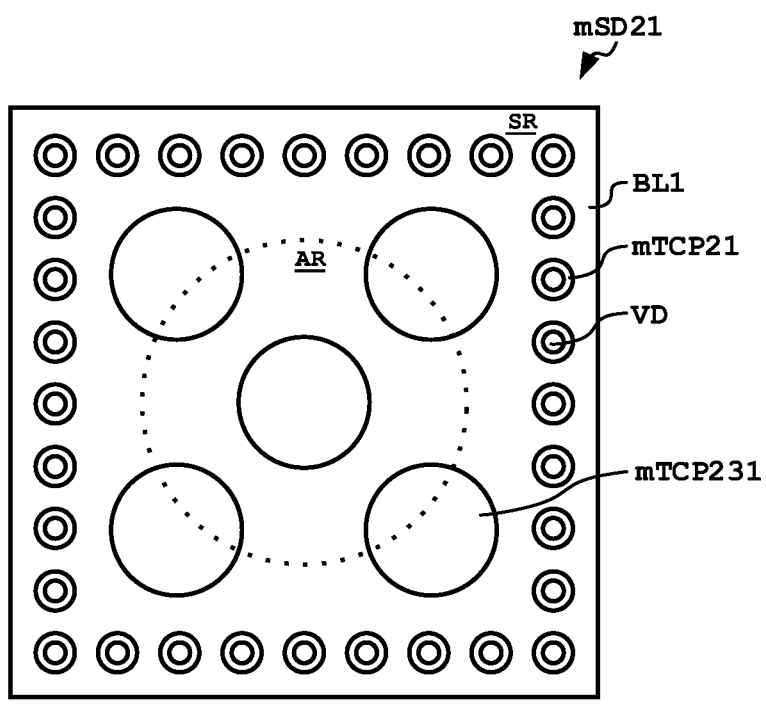
FIG. 25 is a cross-sectional view showing an exemplary configuration of a main portion of a semiconductor device according to a first modification of the second embodiment.

FIG. 25 is a cross-sectional view showing an exemplary configuration of a main portion of a semiconductor device mSD21 according to a first modification of the second embodiment. FIG. 25 corresponds to FIG. 24 and shows a cross-sectional view of a semiconductor device mSD21 at a cross section perpendicular to the thickness direction of the semiconductor substrate SSB2 and passing through the third thermal conductive portion mTCP231.

As shown in FIG. 25, in the first modification, the thermal conductive film TCF2 includes a plurality of the first thermal conductive portion mTCP21 and a plurality of the third thermal conductive portion mTCP231.

The cross-sectional shape of the first thermal conductive portion mTCP21 in the cross section is a substantially circular shape. The plurality of the first thermal conductive portion mTCP21 are arranged along the four sides constituting an outer edges of the semiconductor device mSD21. In the cross section, the plurality of first thermal conductive portions mTCP21 surround the plurality of third thermal conductive portions mTCP231. The thermal conductive film TCF2 preferably includes a plurality of third thermal conductive portion mTCP231 from the viewpoint of maintaining the mechanical strength of substrate.

The cross-sectional shape of the third thermal conductive portion mTCP231 in the cross section is a substantially circular shape. The third thermal conductive portion mTCP231 is formed at a position corresponding to the first pad opening POP1 formed in the insulating layer IL. The cross-sectional shape of the thermal conductive portion mTCP231 is substantially circular, it is preferable from the viewpoint of uniformity of stresses.

SECOND MODIFICATION OF SECOND EMBODIMENT

Figure 26:
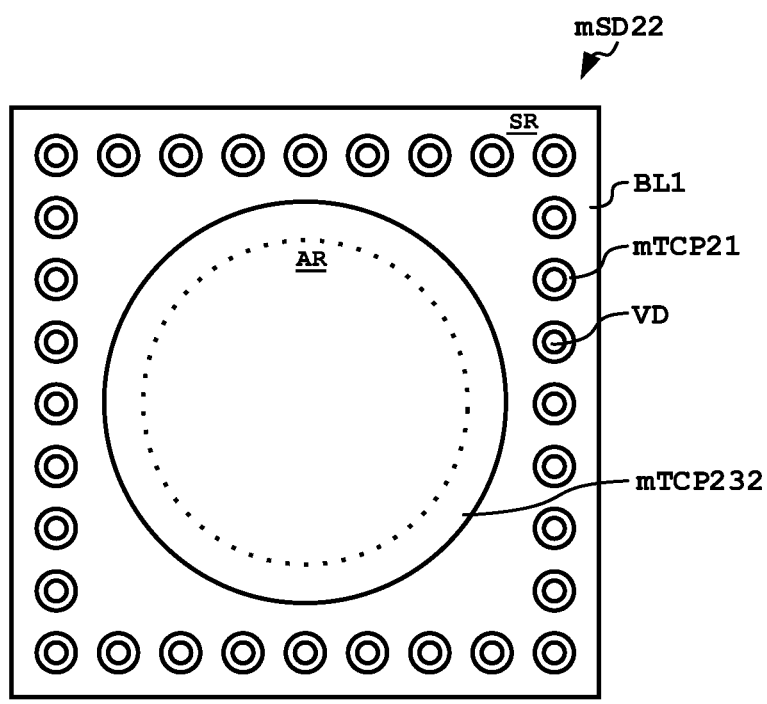
FIG. 26 is a cross-sectional view showing an exemplary configuration of a main portion of a semiconductor device according to a second modification of the second embodiment.

FIG. 26 is a cross-sectional view showing an exemplary configuration of a main portion of a semiconductor device mSD22 according to a second modification of the second embodiment. FIG. 26 corresponds to FIG. 24 and is a cross-sectional view showing the semiconductor device mSD22 at a cross section perpendicular to the thickness direction of the semiconductor substrate SSB2 and passing through the third thermal conductive portion mTCP232.

The semiconductor device mSD23 according to the third modification is similar to the semiconductor device mSD22 according to the second modification of the second embodiment, except that the semiconductor device mSD23 includes a plurality of the third thermal conductive portions mTCP23. It is preferable that the semiconductor device mSD23 includes the plurality of third thermal conductive portions mTCP23 from the viewpoint of maintaining the mechanical strength of substrate.

THIRD EMBODIMENT

Figure 27:
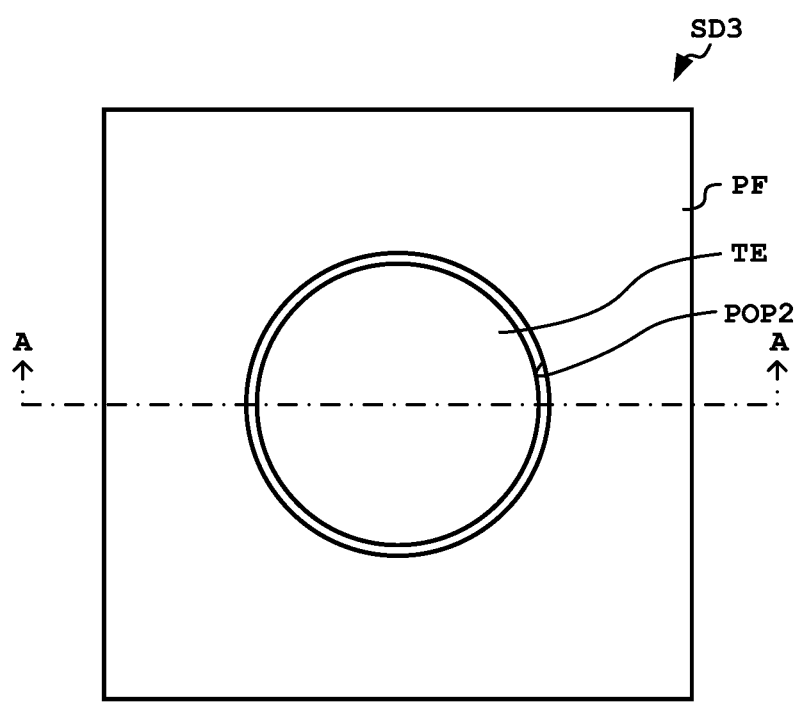
FIG. 27 is a plan view showing an exemplary configuration of a semiconductor device according to a third embodiment.
Figure 28:
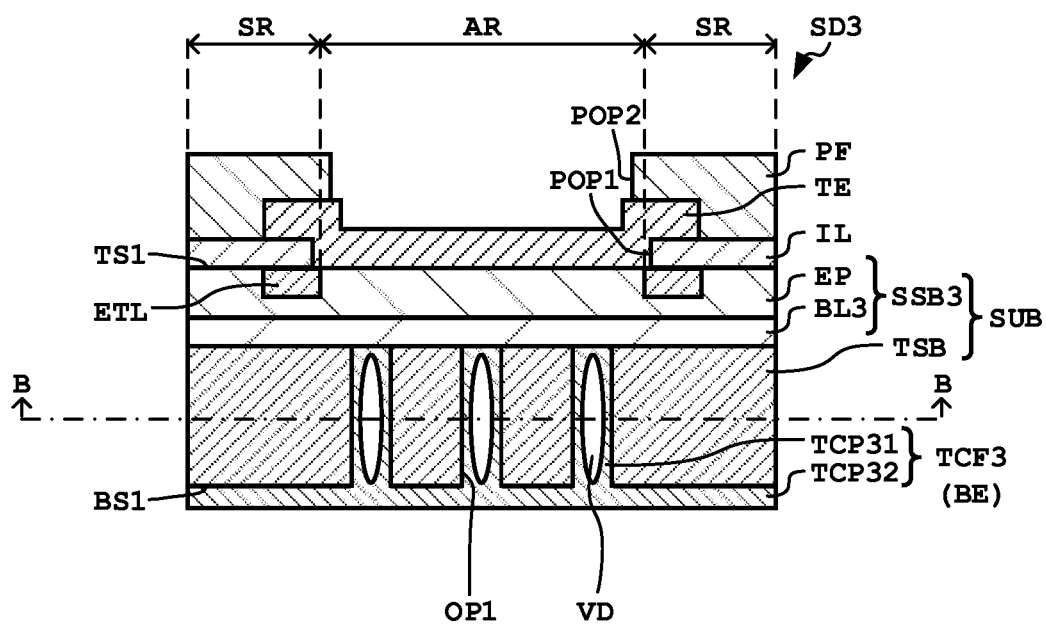
FIG. 28 is a cross-sectional view of the semiconductor device taken along line A-A of FIG. 27.

As shown in FIG. 27 and FIG. 28, a semiconductor device SD3 according to a third embodiment includes a thermal conductor substrate TSB in which a first opening OP1 is formed, and a semiconductor substrate SSB3. A thermal conductive film TCF3 for heat dissipation is formed such that a void VD is formed in the inside of the first opening OP1.

The semiconductor device SD3 according to the third embodiment differs from the semiconductor device SD1 according to the first embodiment mainly in the configuration of substrate. Therefore, the same constituent elements as those of the semiconductor device SD1 according to the first embodiment are denoted by the same reference numerals, and descriptions thereof are omitted.

(CONFIGURATION OF SEMICONDUCTOR DEVICE)

Figure 29:
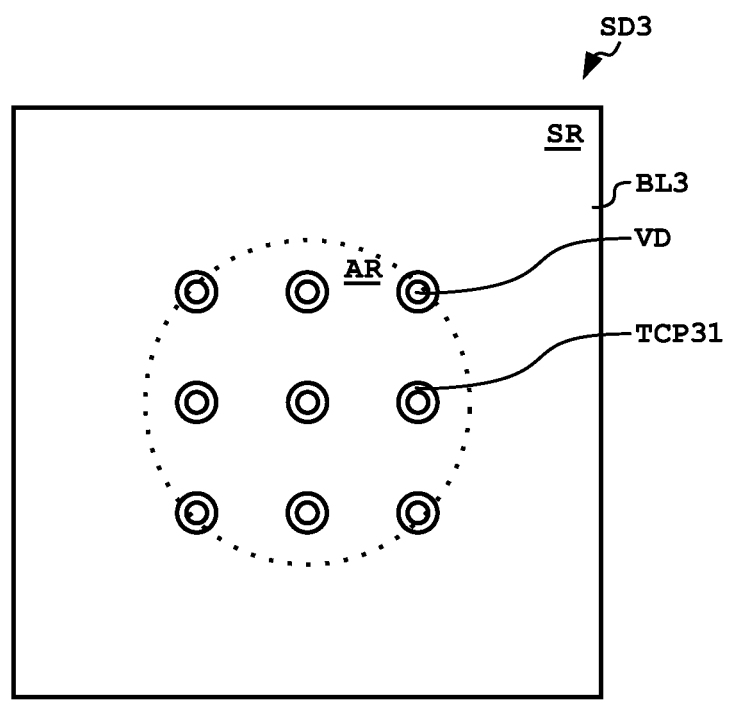
FIG. 29 is a cross-sectional view of the semiconductor device taken along line B-B of FIG. 28.
Figure 30:
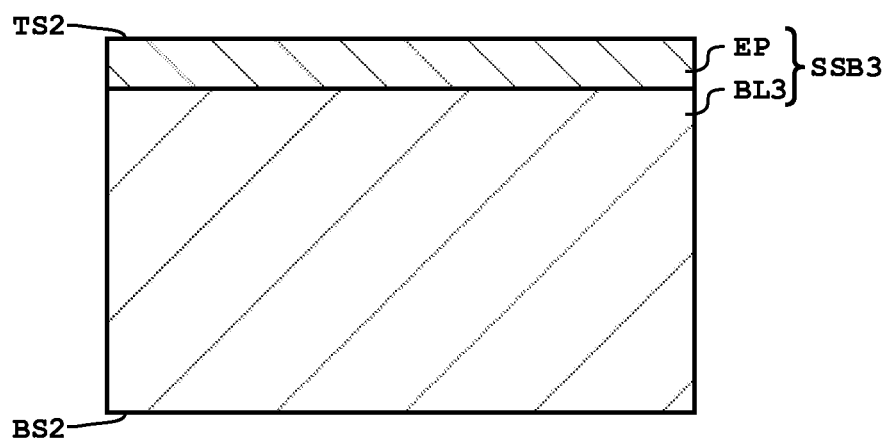
FIG. 30 is a cross-sectional view showing an exemplary step included in a method of manufacturing the semiconductor device according to the third embodiment.
Figure 31:
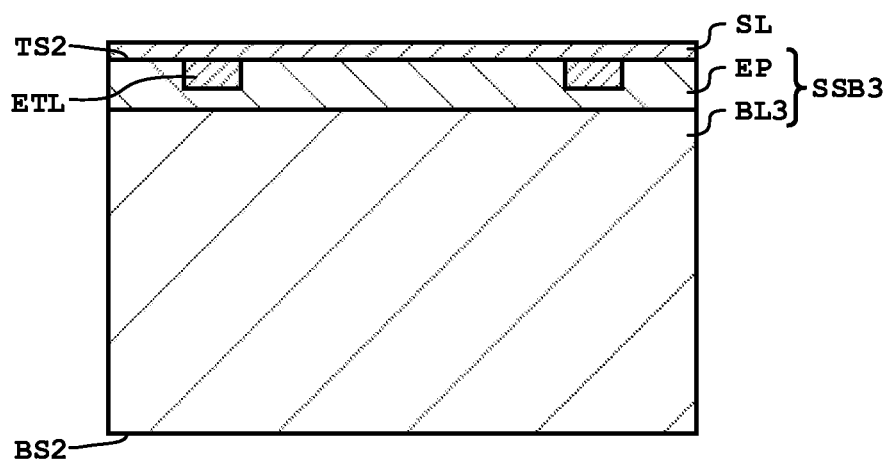
FIG. 31 is a cross-sectional view showing an exemplary step included in the method of manufacturing the semiconductor device according to the third embodiment.
Figure 32:
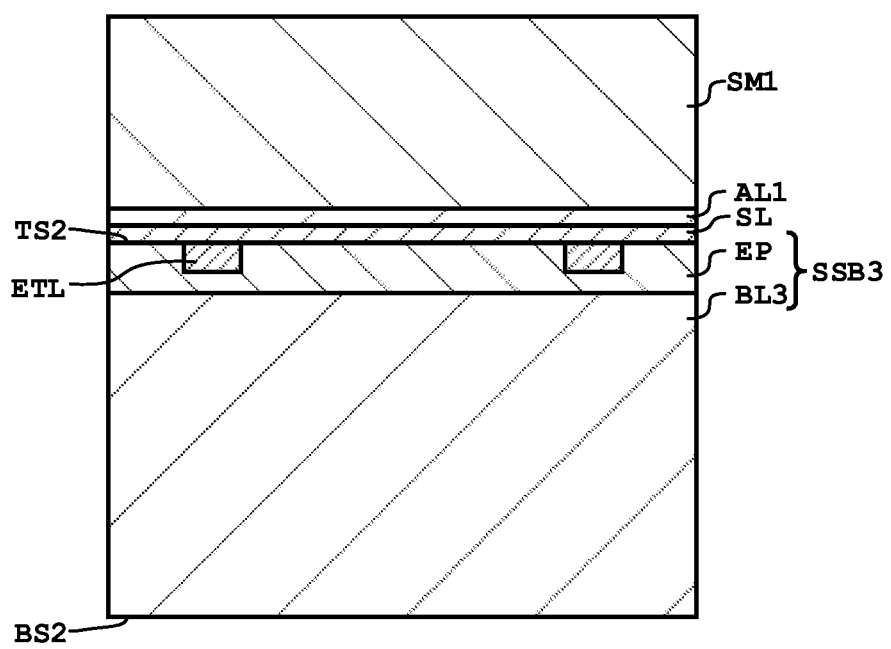
FIG. 32 is a cross-sectional view showing an exemplary step included in the method of manufacturing the semiconductor device according to the third embodiment.
Figure 33:
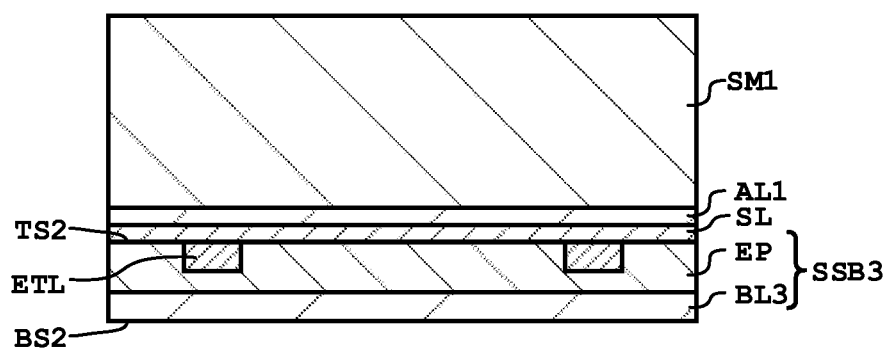
FIG. 33 is a cross-sectional view showing an exemplary step included in the method of manufacturing the semiconductor device according to the third embodiment.

FIG. 27 is a plan view showing an exemplary configuration of a semiconductor device SD3 according to a third embodiment. FIG. 28 is a cross-sectional view showing the semiconductor device SD3 taken along line A-A of FIG. 27. FIG. 29 is a cross-sectional view showing semiconductor device SD3 in line B-B taken along FIG. 28.

The semiconductor device SD 3 includes a substrate SUB, an insulating layer IL, a top electrode TE, a thermal conductive film TCF3, and a protective film PF. The substrate SUB includes a thermal conductor substrate TSB (first substrate) and a semiconductor substrate SSB3 (second substrate). In the third embodiment, the thermal conductive film TCF3 also functions as a back electrode BE.

The substrate SUB has a top surface (upper surface) TS1 and a back surface (bottom) BS1 located opposite to each other. The substrate SUB includes a thermal conductor substrate TSB and a semiconductor substrate SSB3 formed on the thermal conductor substrate TSB.

The back surface of the thermal conductor substrate TSB, the first opening OP1 is formed. The bottom surface of the first opening OP1 may be located in the thermal conductor substrate TSB or in the semiconductor substrate SSB3. In the third embodiment, the bottom surface of the first opening OP1 is located in the thermal conductor substrate TSB. More specifically, a bottom surface of the first opening OP1 is located on the interface between the thermal conductor substrate TSB and the semiconductor substrate SSB3. At a bottom portion of the first opening OP1, the base layer BL3 of the semiconductor substrate SSB3 is exposed.

From the viewpoint of increasing the strength of the thermal conductor substrate TSB to prevent cracking of the wafer, a thickness of the thermal conductor substrate TSB is preferably large. For example, the thickness of the thermal conductor substrate TSBs is preferably 50 µm or more, more preferably 100 µm or more. Further, from the viewpoint of increasing the heat dissipation, the thickness of the heat conductor substrate TSB is preferably small. For example, the thickness of the thermal conductor substrate TSB is preferably 300 μm or less, more preferably 150 μm or less.

The material of the thermal conductor substrate TSB may be greater than the thermal conductivity of the material of semiconductor substrate SSB3, may be the same as the material of the thermal conductive film TCF3, or may be the same as the material of the back electrode BE. In the third embodiment, the material of the thermal conductor substrate TSB is the same as the material of the back electrode BE.

The semiconductor substrate SSB3 includes a base layer BL3, and an epitaxial layer EP formed on the base layer BL3. The base layer BL3 is located on the back surface BS1 side of semiconductor substrate SSB3, and the epitaxial layer EP is located on the top surface TS1 side of the semiconductor substrate SSB3.

The substrate SUB according to third embodiment includes thermal conductor substrate TSB with superior heat dissipation properties. Therefore, the thickness of the base layer BL3 may be small. The thickness of the base layer BL3 is, for example, 0.5 μm or more and 20 μm or less. An example of the material of the base layer BL3 (semiconductor substrate SSB3) is the same as the example of the material of the base layer BL1 in first embodiment.

The thermal conductive film TCF3 includes a first thermal conductive portion TCP31 and a second thermal conductive portion TCP32. The thermal conductive film TCF3 also functions as a back electrode BE. The material of the thermal conductive film TCF3 is the same as the material of the back electrode BE. Except for the materials, a configuration of the thermal conductive film TCF3 is the same as a configuration of the thermal conductive film TCF1 of according to the first embodiment.

(Method of Manufacturing Semiconductor Device)

Next, an exemplary method of manufacturing the semiconductor device SD3 according to the third embodiment will be described. FIGS. 30 to 43 are cross-sectional views showing exemplary steps included in the method of manufacturing the semiconductor device SD3.

The method of manufacturing the semiconductor device SD3 according to the third modification includes (1) providing a semiconductor substrate SSB3, (2) formation an edge termination layer ETL, (3) disposing a first support member SM1, (4) grinding a semiconductor substrate SSB3, (6) providing a thermal conductor substrate TSB, (7) forming a thermal conductive film (back electrode BE), (8) laminating a thermal conductor substrate TSB with the semiconductor device SSB3, (9) disposing a second support member SM2, (10) removing the first support member SM1, (11) forming an insulating layer IL, (12) forming a top electrode TE, (13) forming a protective film PF, and (14) removing the second support member OP1.

As shown in FIGS. 30 to 33, (1) the providing the semiconductor substrate SSB3 to (4) the grinding the semiconductor substrate SSB3 are performed in the same manner as in first embodiment. Incidentally, the semiconductor substrate SSB3 has a top surface TS2 and a back surface BS2 located opposite to each other.

(5) Providing a Thermal Conductor Substrate TSB

Figure 34:
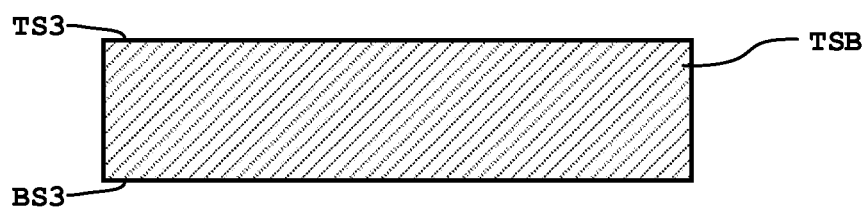
FIG. 34 is a cross-sectional view showing an exemplary step included in the method of manufacturing the semiconductor device according to the third embodiment.

Subsequently, as shown in FIG. 34, a thermal conductors substrate TSB is provided. The thermal conductor substrate TSB has a top surface TS3 and a back surface BS3 located opposite to each other. The thickness and materials of the thermal conductor substrate TSB are as previously described.

(6) Forming a First Opening OP1

Figure 35:
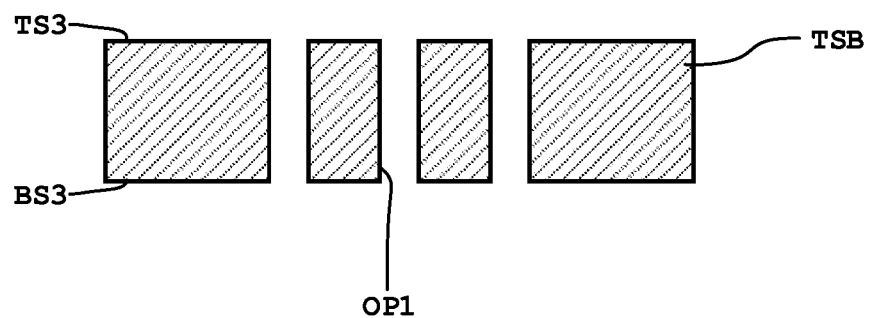
FIG. 35 is a cross-sectional view showing an exemplary step included in the method of manufacturing the semiconductor device according to the third embodiment.

Subsequently, as shown in FIG. 35, a first opening OP1 is formed on the back surface BS3 of the thermal conductor substrate TSB. Specifically, a first opening OP1 is formed by a photolithography method, in a state where the photoresist mask is formed on the back surface BS of the semiconductor substrate SSB. The method of forming the first opening OP1 is, for example, a RIE (Reactive Ion Etching) method using BCl3 gases.

(7) Forming a Thermal Conductive Film TCF3 (Back Electrode BE)

Figure 36:
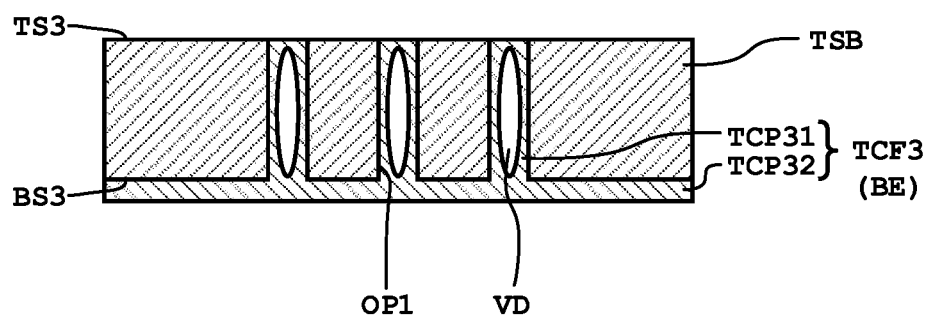
FIG. 36 is a cross-sectional view showing an exemplary step included in the method of manufacturing the semiconductor device according to the third embodiment.

Subsequently, as shown in FIG. 36, a thermal conductive film TCF3 is formed in the first opening OP1 so that the void VD is formed in the first opening OP1.

(8) Laminating the Thermal Conductor Substrate CSB with the Semiconductor Substrate SSB3

Figure 37:
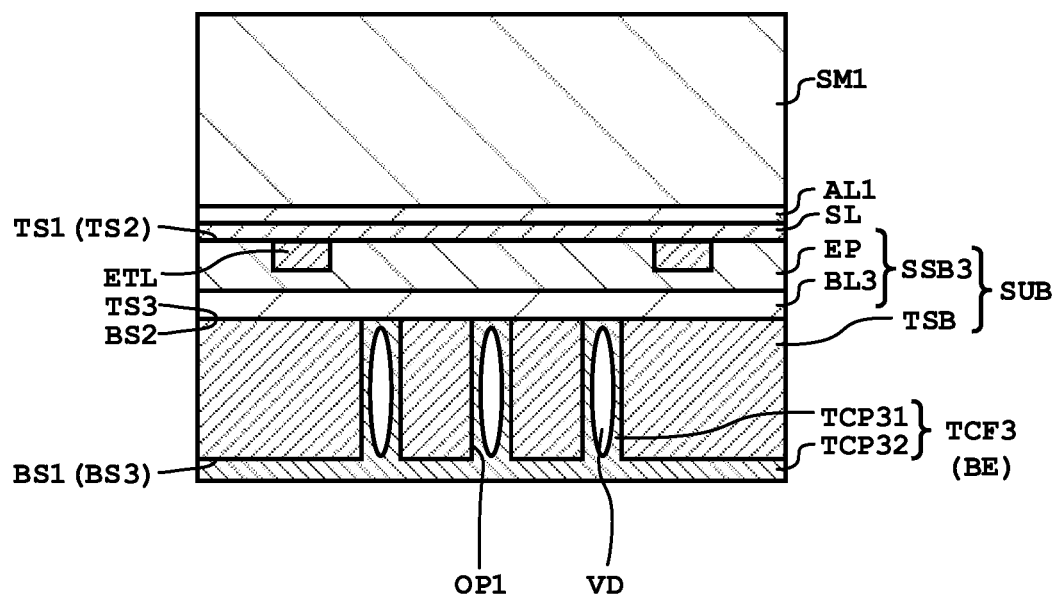
FIG. 37 is a cross-sectional view showing an exemplary step included in the method of manufacturing the semiconductor device according to the third embodiment.
Figure 38:
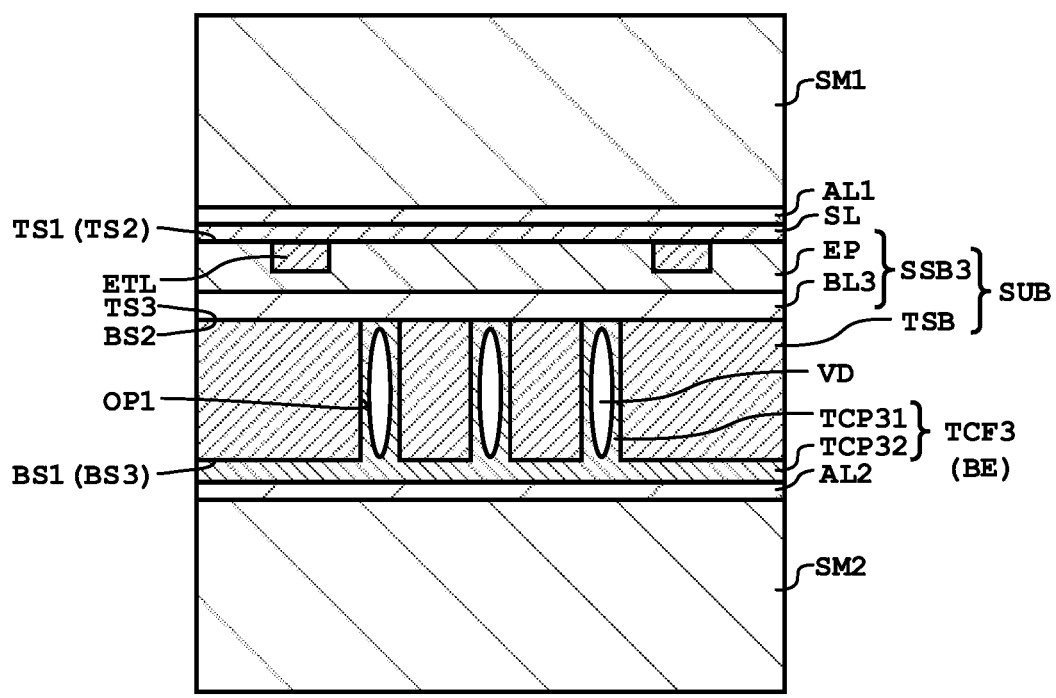
FIG. 38 is a cross-sectional view showing an exemplary step included in the method of manufacturing the semiconductor device according to the third embodiment.
Figure 39:
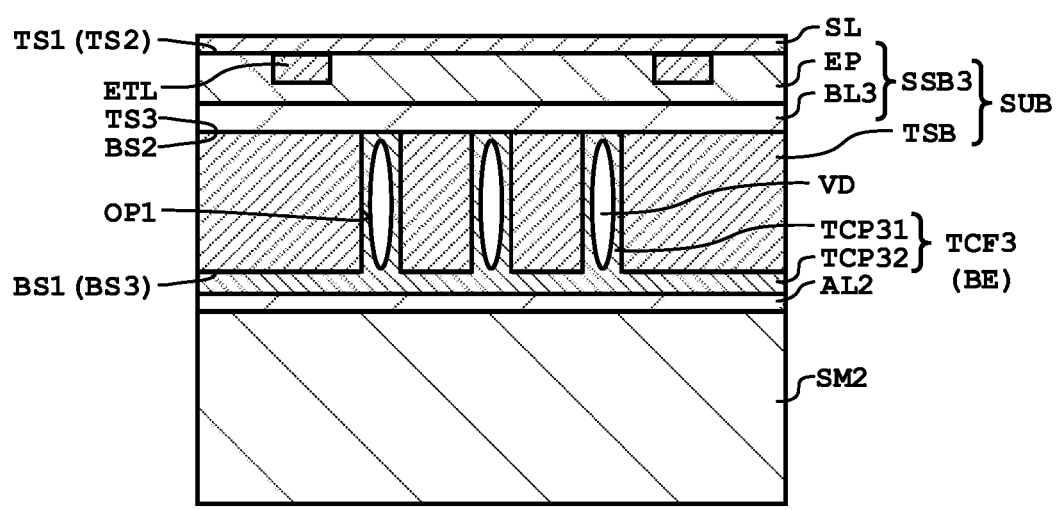
FIG. 39 is a cross-sectional view showing an exemplary step included in the method of manufacturing the semiconductor device according to the third embodiment.
Figure 40:
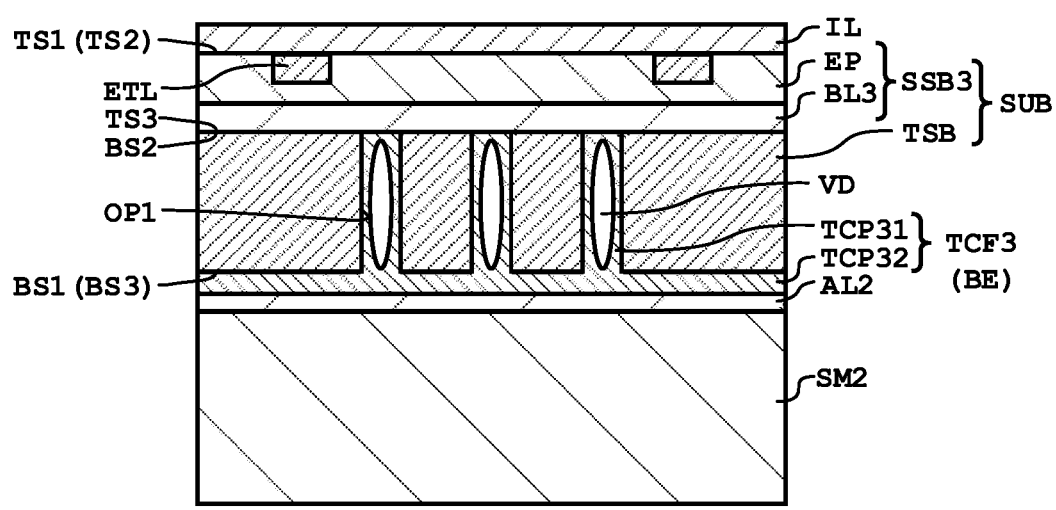
FIG. 40 is a cross-sectional view showing an exemplary step included in the method of manufacturing the semiconductor device according to the third embodiment.
Figure 41:
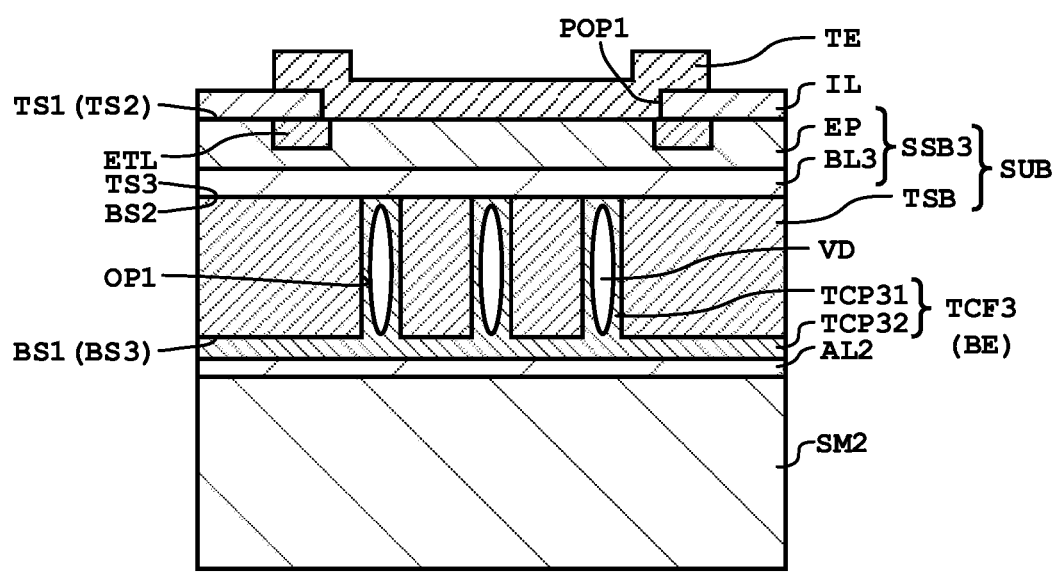
FIG. 41 is a cross-sectional view showing an exemplary step included in the method of manufacturing the semiconductor device according to the third embodiment.
Figure 42:
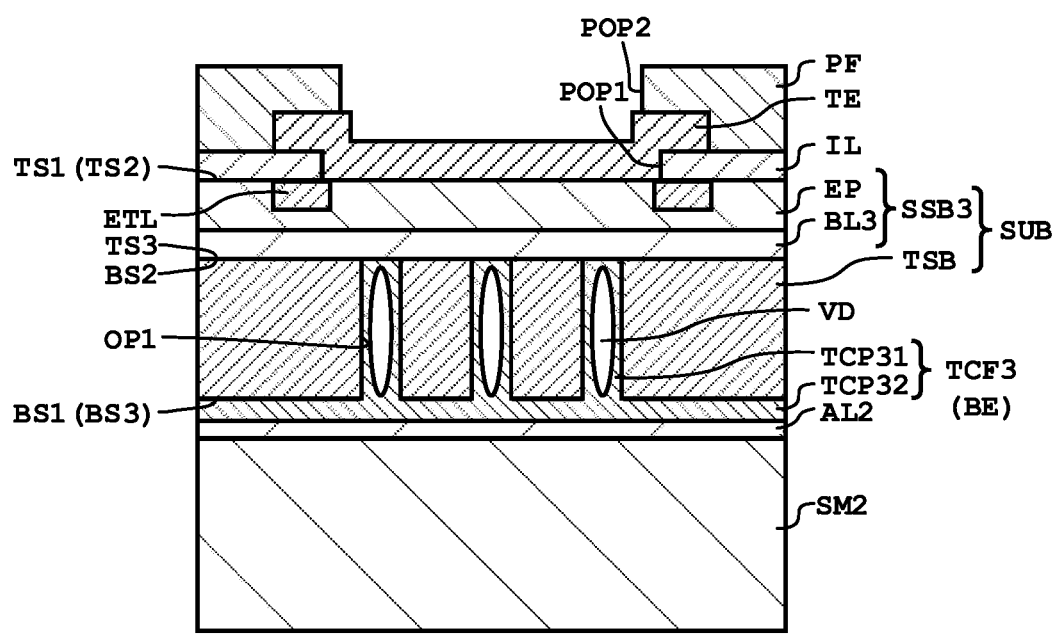
FIG. 42 is a cross-sectional view showing an exemplary step included in the method of manufacturing the semiconductor device according to the third embodiment.
Figure 43:
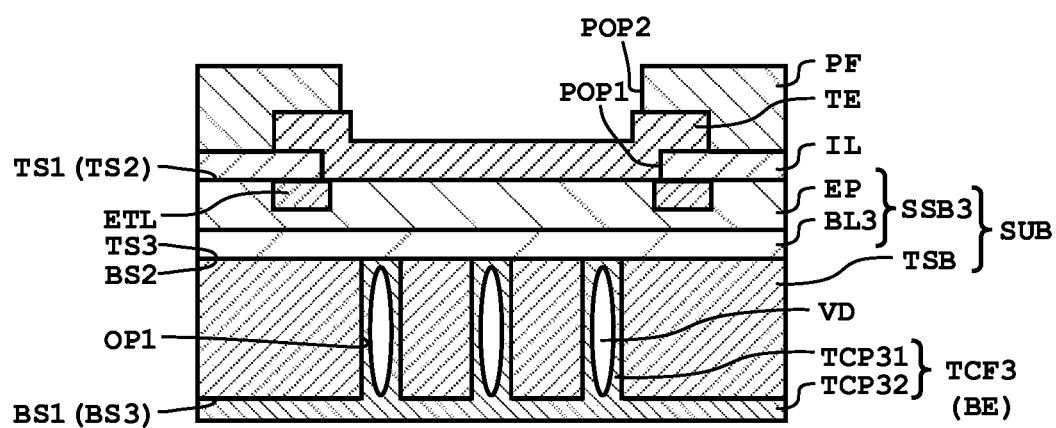
FIG. 43 is a cross-sectional view showing an exemplary step included in the method of manufacturing the semiconductor device according to the third embodiment.

Subsequently, as shown in FIG. 37, the top surface TS3 of the thermal conductor substrate TSB and the back surface BS2 of the semiconductor substrate SSB3 are laminated to each other. Specifically, they are laminated together by vacuum heat treatment.

As shown in FIGS. 38 to 43, (9) the disposing a second support member SM2 to (14) the removing the second support member SM2 is performed in the same manner as in method of manufacturing the semiconductor device SD1 according to the first embodiment.

By the above manufacturing method, the semiconductor device SD3 according to the third embodiment can be manufactured.

(Effect)

Also in the semiconductor device SD3 of according to the third embodiment, the first thermal conductive portion TCP31 of the thermal conductive film TCF3 is formed on the back surface BS3 of the thermal conductor substrate TSB such that the void VD is formed in the first opening OP1 of the thermal conductor substrate TSB. Therefore, the third embodiment has the similar effects as the first embodiment. In addition, the thickness of the semiconductor substrate SSB3 can be reduced in the semiconductor device SD3 according to the third embodiment because the thermal conductor substrate TSB has excellent thermal conductivity. In other words, the third embodiment can further enhance the heat dissipation of the semiconductor device SD3.

It should be noted that the present invention is not limited to the above-mentioned embodiments, and various modifications can be made without departing from the gist thereof. For example, in the above-described embodiment, as a semiconductor element, semiconductor device SD1~SD3 in which a Schottky barrier diode is formed, the semiconductor element may be a normally off type MOSFET. Examples of the normally-off type MOSFET include: a vertical normally-off type MOSFET described in Japanese Unexamined Patent Application Publication No. 2016-207827; and a vertical normally-off type MOSFET described in Japanese Unexamined Patent Application Publication No. 2018-182247.

Even when the semiconductor element of the semiconductor device according to the first embodiment and the third embodiment is the normally-off type MOSFET, it is preferable that the first thermal conductive portion TCP31, TCP32 is formed in the active region AR in which the main current flows among semiconductor substrate SSB1 and SSB3 in plan view.

Even when the semiconductor element of the semiconductor device according to the second embodiment is the normally-off type MOSFET, it is preferable that the third thermal conductive portion TCP3 is formed in an active region for causing a main current to flow in the semiconductor substrate SSB3 in plan view, and the first thermal conductive portion TCP1 is formed in a peripheral region surrounding the active region in plan view. In this case, the "main current" is the current flowing, for example, between the source electrode and the drain electrode.

[Additional statement 1]

A method of manufacturing a semiconductor device includes:

providing a substrate having a top surface and a back surface located opposite to each other;

disposing a first support member on the surface of substrate;

after the disposing the first support member, forming a first opening on the back surface of the substrate; and forming a thermal conductive film in the first opening so that a void is formed in the first opening.

[Additional statement 2]

A method of manufacturing a semiconductor device includes:

providing a first substrate having a top surface and a back surface located opposite to each other;

disposing a first support member on the top surface of the first substrate;

providing a second substrate having a top surface and a back surface located opposite to each other;

forming a first opening on the back surface of the second substrate;

forming a thermal conductive film in the first opening so that a void is formed in the first opening; and after forming the thermal conductive film, laminating the top surface of the second substrate with the back surface of the first substrate to each other, a thermal conductivity of the second substrate and a thermal conductivity of the thermal conductive film are greater than a thermal conductivity of the first substrate.

What is claimed is:

1. A semiconductor device comprising:
   a substrate having an upper surface and a lower surface located opposite to each other, and having a first opening formed on the lower surface; and
   a thermal conductive film comprising a first thermal conductive portion formed in the first opening,
   wherein the first thermal conductive portion is embedded in the first opening such that a void is formed in the first opening.

2. The semiconductor device according to claim 1, wherein the thermal conductive film comprises a second thermal conductive portion formed on the lower surface of the substrate and integrally formed with the first thermal conductive portion as a single member.

3. The semiconductor device according to claim 1, wherein the substrate is semiconductor substrate.

4. The semiconductor device according to claim 1, wherein the thermal conductive film comprises a plurality of the first thermal conductive portions formed spaced apart from each other in a cross section perpendicular to a thickness direction of the substrate and passing through the first thermal conductive portion.

5. The semiconductor device according to claim 4, wherein a cross-sectional shape of the first thermal conductive portion in the cross-section is substantially circular.

6. The semiconductor device according to claim 4, wherein the cross-sectional shape of the first thermal conductive portion in the cross section is substantially rectangular.

7. The semiconductor device according to claim 4, wherein the plurality of first thermal conductive portions are arranged in a grid shape in the cross section.

8. The semiconductor device according to claim 1, wherein a second opening is formed on the lower surface of the substrate, and wherein the thermal conductive film comprises a third thermal conductive portion embedded in the second opening without a void formed in the second opening.

9. The semiconductor device according to claim 8, wherein the semiconductor device comprises:
   an active region in which a main current flow in the substrate; and
   a peripheral region surrounding the active region,
   wherein the first thermal conductive portion is formed in the peripheral region, and
   wherein the third thermal conductive portion is formed in the active region.

10. The semiconductor device according to claim 9, wherein the thermal conductive film comprises a plurality of the first thermal conductive portions surrounding the third thermal conductive portion in a cross section perpendicular to a thickness direction of the substrate and passing through the first thermal conductive portion.

11. The semiconductor device according to claim 10, wherein a cross-sectional shape of the first thermal conductive portion is substantially rectangular in the cross section, and
    wherein a cross-sectional shape of the third thermal conductive portion is substantially rectangular in the cross section.

12. The semiconductor device according to claim 10, wherein a cross-sectional shape of the first thermal conductive portion is substantially circular in the cross section, and
    wherein a cross-sectional view of the third thermal conductive portion is substantially circular in the cross section.

13. The semiconductor device according to claim 1, wherein a thermal conductivity of a material of the thermal conductive film is greater than a thermal conductivity of a material of the substrate.

14. The semiconductor device according to claim 13, wherein the thermal conductivity of the material of the thermal conductive film is 10 times or more than the thermal conductivity of the material of the substrate.

15. The semiconductor device according to claim 1, wherein a thermal expansion coefficient of a material of the thermal conductive film and a thermal expansion coefficient of a material of the substrate differ from each other.

16. The semiconductor device according to claim 1, wherein a material of the substrate is gallium oxide, gallium nitride, silicon or silicon carbide.

17. The semiconductor device according to claim 1, wherein a material of the thermal conductive film is at least one material selected from the group consisting of aluminum, aluminum oxide, aluminum nitride, gold, silver, copper, molybdenum, tungsten, nickel, palladium, titanium, titanium nitride, tantalum, tantalum nitride, silicon nitride, and diamond.

18. The semiconductor device according to claim 1, wherein the substrate comprises:
    a first substrate in which the first opening is formed; and
    a second substrate formed on the first substrate,
    wherein a thermal conductivity of the second substrate and a thermal conductivity of the thermal conductive film are greater than a thermal conductivity of the first substrate.

* * * * *